United States Patent
Bassov et al.

(10) Patent No.: US 11,157,188 B2
(45) Date of Patent: Oct. 26, 2021

(54) DETECTING DATA DEDUPLICATION OPPORTUNITIES USING ENTROPY-BASED DISTANCE

(71) Applicant: EMC IP Holding Company LLC, Hopkinton, MA (US)

(72) Inventors: Ivan Bassov, Brookline, MA (US); Sorin Faibish, Newton, MA (US); Istvan Gonczi, Berkley, MA (US); Philippe Armangau, Acton, MA (US)

(73) Assignee: EMC IP Holding Company LLC, Hopkinton, MA (US)

( * ) Notice: Subject to any disclaimer, the term of this patent is extended or adjusted under 35 U.S.C. 154(b) by 71 days.

(21) Appl. No.: 16/393,025

(22) Filed: Apr. 24, 2019

(65) Prior Publication Data
US 2020/0341667 A1 Oct. 29, 2020

(51) Int. Cl.
G06F 3/06 (2006.01)
G06F 12/1018 (2016.01)
G06K 9/62 (2006.01)

(52) U.S. Cl.
CPC .......... G06F 3/0641 (2013.01); G06F 3/0608 (2013.01); G06F 3/0644 (2013.01); G06F 3/0683 (2013.01); G06F 12/1018 (2013.01); G06K 9/6215 (2013.01); G06K 9/6298 (2013.01)

(58) Field of Classification Search
CPC .... G06F 3/0641; G06F 3/0608; G06F 3/0644; G06F 3/0683; G06F 9/6298; G06F 9/6215; G06F 12/1018
See application file for complete search history.

(56) References Cited

U.S. PATENT DOCUMENTS

2010/0235392 A1* 9/2010 McCreight ............ G06F 21/645
707/780
2013/0179408 A1* 7/2013 Stoakes ............... G06F 16/1752
707/692
(Continued)

OTHER PUBLICATIONS

Ivan Bassov, et al., "Detecting Data Deduplication Opportunities Using Hash Distance," U.S. Appl. No. 16/392,964, filed Apr. 24, 2019.
(Continued)

*Primary Examiner* — Kalpit Parikh
(74) *Attorney, Agent, or Firm* — Muirhead and Saturnelli, LLC

(57) ABSTRACT

Techniques for processing data may include: receiving a candidate data block; computing a distance using a distance function, wherein the distance is an entropy-based distance and denotes a measurement of similarity between the candidate data block and a target data block; and determining, using the distance, whether to perform data deduplication of the candidate data block with respect to the target data block to identify at least one sub-block of the candidate data block that is a duplicate of at least one sub-block of the target data block. If the distance is less than a threshold, it may be expected to have a matching sub-block between the candidate and target data blocks. The distance may be a difference between entropy values for the candidate and target data blocks. The first entropy value may be used to determine whether to compress or perform partial deduplication for the candidate data block.

21 Claims, 17 Drawing Sheets

(56) References Cited

U.S. PATENT DOCUMENTS

2014/0279953 A1* 9/2014 Aronovich .......... G06F 16/1752
707/692
2015/0242122 A1* 8/2015 Yeh ........................ G06F 3/061
711/103

OTHER PUBLICATIONS

Werner Ebeling, et al., "Entropy and Compressibility of Symbol Sequences," Institute of Physics, Humboldt University, PhysComp96, Feb. 23, 1997.

"Entropy (information theory)," Wikipedia, https://en.wikipedia.org/wiki/Entropy_(information_theory), Sep. 9, 2018.

Kedarnath J. Balakrishnan, et al., "Relationship Between Entropy and Test Data Compression," IEEE Transactions on Computer-Aided Design of Integrated Circuits and Systems, vol. 26, No. 2, Feb. 2007.

ForensicKB, "Computer Forensics, Malware Analysis & Digital Investigations," http://www.forensickb.com/2013/03/file-entropy-explained.html, Sep. 12, 2018.

Theory of LSH, "Distance Measures LS Families of Hash Functions S-Curves", 2009, http://infolab.stanford.edu/~ullman/mining/2009/similarity.pdf.

Frank Breitinger, et al., "Similarity Hashing Based on Levenshtein Distances," HAL archives-ouvertes.fr, HAL ID: hal01393767, https://hal.inria.fr/hal-01393767, Nov. 8, 2016.

\* cited by examiner

1300

1310

| 1310a | 1310b | | | |
|---|---|---|---|---|
| 0000 0000 | 0000 0001 | 0000 0010 | 0000 0011 | 0000 0000 |
| 0000 0000 | 0000 0000 | 0000 0000 | 0000 0000 | 0000 0000 |
| ⋮ | ⋮ | ⋮ | ⋮ | ⋮ |

1320

| | 1320a | 1320b | 1320c | 1320d |
|---|---|---|---|---|
| | Symbol $X_i$ | Numeric value of symbol $X_i$ | Frequency | Probability $P_i$ |
| 1322 | 0000 0000 | 0 | 2048 | 2048/4096 = .50 |
| 1324 | 0000 0001 | 1 | 1024 | 1024/4096 = .25 |
| 1326 | 0000 0010 | 2 | 512 | 512/4096 = .125 |
| 1328 | 0000 0011 | 3 | 512 | 512/4096 = .125 |
| | 0000 0100 | 4 | 0 | 0 |
| | 0000 0101 | 5 | 0 | 0 |
| 1330 | 0000 0110 | 6 | 0 | 0 |
| | ⋮ | ⋮ | ⋮ | ⋮ |
| | 1111 1111 | 255 | 0 | 0 |

| Entropy 1202 | Reference (Ref) 1204 |
|---|---|
| 1.5 | Ref1 |
| 1.6 | Ref2 |
| 1.7 | Ref3 |
| 2.5 | Ref4 |
| ⋮ | ⋮ |
| 3.0 | Ref G |
| ⋮ | ⋮ |
| 6.0 | Ref H |
| ⋮ | ⋮ |

1210 — 1.5 row
1211 — 1.6 row
1212 — 1.7 row

FIG. 12B

DETECTING DATA DEDUPLICATION OPPORTUNITIES USING ENTROPY-BASED DISTANCE

BACKGROUND

Technical Field

This application generally relates to data storage and, more particularly to data deduplication techniques.

Description of Related Art

Data storage systems are arrangements of hardware and software in which storage processors are coupled to arrays of non-volatile storage devices, such as magnetic disk drives, electronic flash drives, and/or optical drives. The storage processors service storage requests, arriving from host machines ("hosts"), which specify blocks, files, and/or other data elements to be written, read, created, deleted, and so forth. Software running on the storage processors manages incoming storage requests and performs various data processing tasks to organize and secure the data elements on the non-volatile storage devices.

Some storage systems support data "deduplication." A common deduplication scheme involves replacing redundant copies of a data block with pointers to a single retained copy. Data deduplication may operate in the background, after redundant data blocks have been stored, and/or operate inline with storage requests. Inline deduplication matches newly arriving data blocks with previously stored data blocks and configures pointers accordingly, thus avoiding initial storage of redundant copies.

A common deduplication scheme involves computing digests of data blocks and storing the digests in a database. Each digest is computed as a hash of a data block's contents and identifies the data block with a high level of uniqueness, even though the digest is typically much smaller than the data block itself. Digests thus enable block matching to proceed quickly and efficiently, without having to compare blocks directly. For each digest, the database stores a pointer that leads to a stored version of the respective data block. To perform deduplication on a particular candidate block, a storage system computes a digest of the candidate block and searches the database for an entry that matches the computed digest. If a match is found, the storage system arranges metadata of the candidate block to point to the data block that the database has associated with the matching digest. In this manner, a duplicate copy of the data block is avoided.

SUMMARY OF THE INVENTION

Embodiments using the techniques herein may include a method, system, and computer readable medium for processing data comprising: receiving a candidate data block; computing a distance using a distance function, wherein the distance is an entropy-based distance and denotes a measurement of similarity between the candidate data block and a target data block; and determining, using the distance, whether to perform data deduplication of the candidate data block with respect to the target data block to identify at least one sub-block of the candidate data block that is a duplicate of at least one sub-block of the target data block. The distance function may compute the distance as a difference between a first entropy value for the candidate data block and a second entropy value for the target data block. The distance function may compute a normalized distance value as the distance. It may be determined whether the distance is less than a threshold distance. Responsive to determining the distance is less than a threshold distance, it may be determined that the candidate data block is similar to the target data block and first processing may be performed. The first processing may include: determining whether at least one sub-block of the candidate data block matches at least one sub-block of the target data block; and responsive to determining at least one sub-block of the candidate data block matches at least one sub-block of the target data block, performing second processing that stores the candidate data block as a partially deduplicated data block with at least one sub-block that is a duplicate of another sub-block of the target data block. Processing performed may include determining whether a first digest matches a second digest, wherein the first digest is computed for the candidate data block using a hash function and wherein the second digest is computed for the target data block using the hash function; responsive to determining the first digest matches the second digest, comparing content of the candidate data block to content of the target data block; determining, in accordance with said comparing whether the candidate data block matches the target data block; and responsive to determining the candidate data block matches the target data block, storing the candidate data block as a fully deduplicated data block. The hash function may be a cryptographic hash function. Processing may include receiving a first entropy value for the candidate data block; determining whether the first entropy value is less than an entropy threshold; and responsive to determining the first entropy value is less than the entropy threshold, performing processing to store the candidate data block in a compressed form. Responsive to determining the first entropy value is not less than the entropy threshold, partial deduplication processing for the candidate data block may be performed. The partial deduplication processing for the candidate block may include performing the steps of computing a distance and determining, using the distance, whether to perform data deduplication of the candidate data block with respect to the target data block to identify at least one sub-block of the candidate data block that is a duplicate of at least one sub-block of the target data block. The target data block may be one of a plurality of target data blocks and each of the plurality of target data blocks may be associated with one of a plurality of entropy values denoting the computed entropy value for each target data block. The target data block may have an associated one of the plurality of entropy values that is closest to the first entropy value with respect to all others of the plurality of entropy values. The processing may be performed as part of inline processing of the candidate data block in connection with an I/O path or data path when servicing an I/O accessing the candidate data block. The processing may be performed offline and not as part of inline processing of the candidate data block in connection with an I/O path or data path when servicing an I/O accessing the candidate data block.

BRIEF DESCRIPTION OF THE DRAWINGS

Features and advantages of the present invention will become more apparent from the following detailed description of exemplary embodiments thereof taken in conjunction with the accompanying drawings in which:

FIG. 12A is an example illustrating a data block and associated information that may be used in connection with calculating an entropy value for the data block an embodiment in accordance with techniques herein.

FIG. 12B is an example illustrating a table of entries of entropy values for target blocks in an embodiment in accordance with the techniques herein.

DETAILED DESCRIPTION OF EMBODIMENT(S)

Unfortunately, conventional deduplication schemes fail to detect redundant data when blocks are similar but not identical. For example, a data storage system might store multiple copies of a given block, which are nearly identical except for a timestamp or label, which is unique to each copy. Owing to the randomizing nature of the hash function, digests computed from the slightly different copies of the data block differ widely from one another, such that deduplication is unable to detect the redundant content. Many opportunities to improve storage efficiency are therefore missed.

In contrast with the prior approach, an improved technique for performing data deduplication operates at sub-block granularity by searching a deduplication database for a match between a candidate sub-block of a candidate block and a target sub-block of a previously-stored target block. When a match is found, the technique identifies a duplicate range shared between the candidate block and the target block and effects persistent storage of the duplicate range by configuring mapping metadata of the candidate block so that it points to the duplicate range in the target block.

Advantageously, improved techniques described herein avoid redundant storage of identical portions of data blocks, even when the data blocks as a whole are different. Storage efficiency is thereby improved.

It should be appreciated that embodiments are provided by way of non-limiting examples to illustrate certain features and principles of the techniques described herein. However, techniques herein are not limited to the particular embodiments described.

Described herein are improved techniques for performing data deduplication that may operate at sub-block granularity by searching a deduplication database for a match between a candidate sub-block of a candidate block and a target sub-block of a previously-stored target block.

When a match is found, the technique identifies a duplicate range shared between the candidate block and the target block and effects persistent storage of the duplicate range by configuring mapping metadata of the candidate block so that it points to the duplicate range in the target block.

Figure 1:
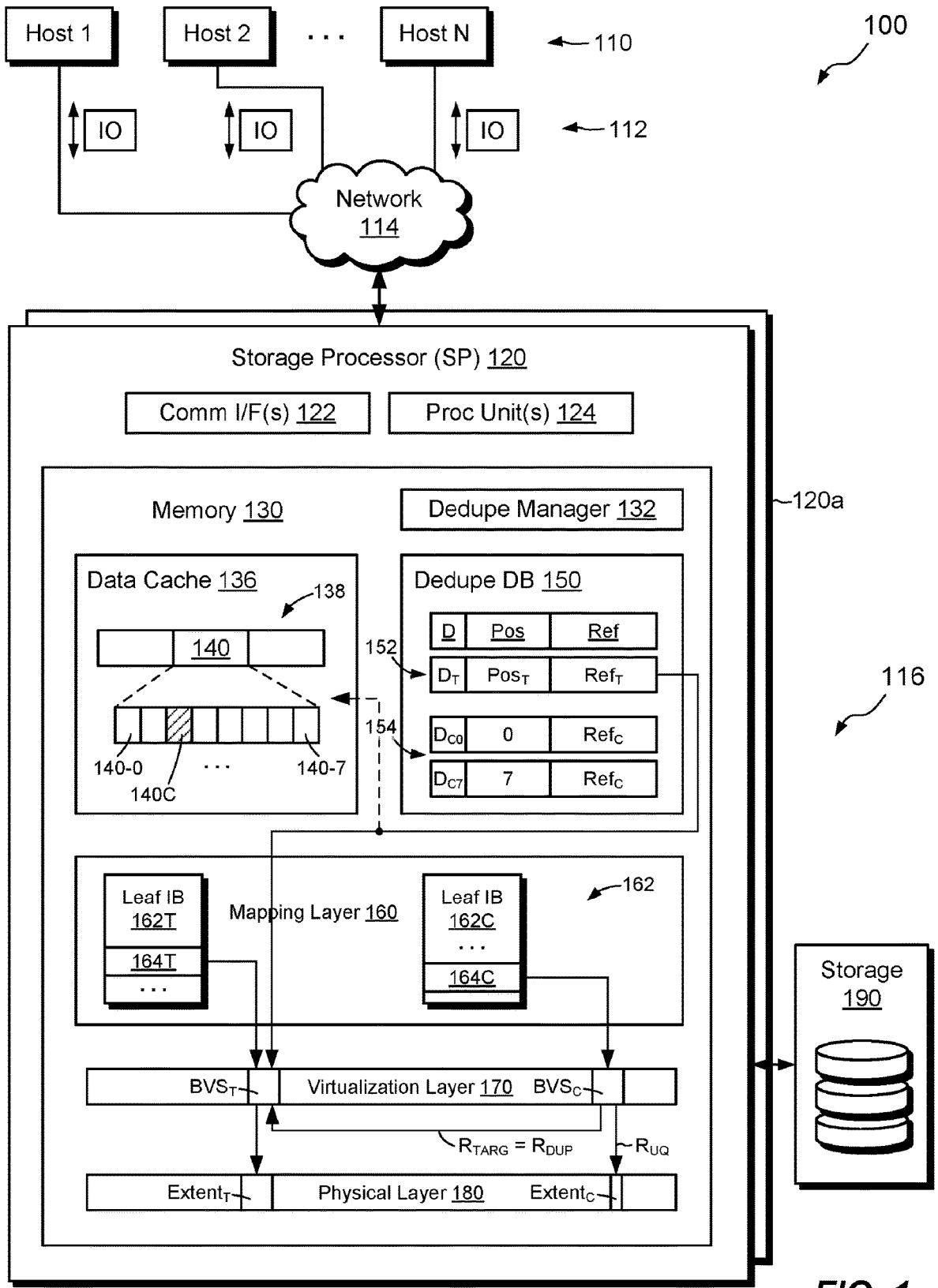
FIG. 1 is a block diagram of an example environment in which embodiments of the improved technique can be practiced.

FIG. 1 shows an example environment 100 in which embodiments of the improved techniques herein can be practiced. Here, multiple hosts 110 access a data storage system 116 over a network 114. The data storage system 116 includes a storage processor, or "SP," 120 and storage 190, such as magnetic disk drives, electronic flash drives, and/or the like. The data storage system 116 may include multiple SPs (e.g., a second SP 120a). For example, multiple SPs may be provided as circuit board assemblies or blades, which plug into a chassis that encloses and cools the SPs. The chassis has a backplane for interconnecting the SPs, and additional connections may be made among SPs using cables. In some examples, the SP 120 is part of a storage cluster, such as one which contains any number of storage appliances, where each appliance includes a pair of SPs connected to shared storage devices. In some arrangements, a host application runs directly on the SP (or SPs), such that separate host machines 110 need not be present. No particular hardware configuration is required, however, as any number of SPs may be provided, including a single SP, in any arrangement, and the SP 120 can be any type of computing device capable of running software and processing host I/O's.

The network 114 may be any type of network or combination of networks, such as a storage area network (SAN), a local area network (LAN), a wide area network (WAN), the Internet, and/or some other type of network or combination of networks, for example. In cases where hosts 110 are provided, such hosts 110 may connect to the SP 120 using various technologies, such as Fibre Channel, iSCSI (Internet small computer system interface), NFS (network file system), and CIFS (common Internet file system), for example. As is known, Fibre Channel and iSCSI are block-based protocols, whereas NFS and CIFS are file-based protocols. The SP 120 is configured to receive I/O requests 112 according to block-based and/or file-based protocols and to respond to such I/O requests 112 by reading or writing the storage 190.

The SP 120 includes one or more communication interfaces 122, a set of processing units 124, and memory 130. The communication interfaces 122 include, for example, SCSI target adapters and/or network interface adapters for converting electronic and/or optical signals received over the network 114 to electronic form for use by the SP 120. The set of processing units 124 includes one or more processing chips and/or assemblies, such as numerous multi-core CPUs. The memory 130 includes both volatile memory, e.g., Random Access Memory (RAM), and non-volatile memory, such as one or more ROMs (Read-Only Memories), disk drives, solid state drives, and the like. The set of processing units 124 and the memory 130 together form control circuitry, which is constructed and arranged to carry out various methods and functions as described herein. Also, the memory 130 includes a variety of software constructs realized in the form of executable instructions. When the executable instructions are run by the set of processing units 124, the set of processing units 124 is made to carry out the operations of the software constructs. Although certain software constructs are specifically shown and described, it is understood that the memory 130 typically includes many other software components, which are not shown, such as an operating system, various applications, processes, and daemons.

As further shown in FIG. 1, the memory 130 "includes," i.e., realizes by execution of software instructions, a data cache 136, a deduplication ("dedupe") manager 132, a deduplication database 150, a mapping layer 160, a virtualization layer 170, and a physical layer 180. The dedupe manager 132 is configured to manage deduplication activities. The data cache 136 may be realized in volatile memory (e.g., RAM) and is configured to store temporarily incoming data arriving from hosts 110. The data cache 136 may also store recently-written and/or read data blocks, to support deduplication. In an example, the data cache 136 defines incoming data 138 from hosts 110 in the form of blocks (such as block 140), where each block is composed of a sequence of sub-blocks (e.g., sub-blocks 140-0 through 140-7). As is known, a "block" is a unit of storage in a data storage system, which generally corresponds to the smallest unit of storage space that can be allocated. Block sizes vary from one storage system to the next, with typical sizes being 4 kB (kilobytes) or 8 kB, for example. In the particular arrangement shown, there are eight sub-blocks per block, and the sub-blocks are contiguous and uniform in size. For example, if the block size is 4 kB, each sub-block would be 512 B, which corresponds to one sector.

The dedupe database 150 is configured to store digests of sub-blocks along with associated information. For example, the dedupe database 150 stores, for each of multiple sub-blocks, a digest "D" of that sub-block and a reference ("Ref") to a location, in the data storage system 116, of a data block that contained the respective sub-block when the database entry was made. The SP 120 computes each digest as a hash of the respective sub-block's contents. Thus, different sub-blocks produce different digests, with rare hash collisions being possible. The reference Ref may take various forms. For example, Ref may point to a memory location in the data cache 136 where the data block is temporarily being held. Alternatively, Ref may point to metadata (e.g., a block virtualization structure) that maps to the data block, such that a persisted version of the data block may be obtained by following the reference to the pointed-to metadata. In some examples, the reference points directly to the data block, e.g., in the physical layer 180. An entry in the dedupe database 150 may further include a sub-block position, "Pos," which indicates a position of the sub-block for that entry in the referenced data block. For example, if the sub-block for a database entry was the first sub-block in the data block that contained it, then the position Pos might be 0. If the sub-block was the last sub-block in the data block, then the position Pos might be 7. In some examples, entries in the dedupe database 150 are created only for first and last sub-blocks of their parent data blocks, such that there are only two possibilities and Pos may be represented with a single bit. In some examples, sub-block position may be tracked using a separate bitmap. The bitmap may be arranged by sub-block and may provide a single bit for each sub-block, to indicate whether the respective sub-block is in the first position or in the last position.

The dedupe database 150 may operate as a memory-resident cache. The cache may utilize an LRU (least-recently used) eviction policy. In some examples, when evicting an entry from the dedupe database 150, the SP 120 also evicts the data block referenced by that entry in the data cache 136. In some cases, the dedupe database 150 is backed by persistent storage, with portions read into volatile memory as needed for fast access.

The mapping layer 160 includes metadata for mapping blocks of data objects, such as LUNs (Logical UNits), file systems, virtual machine disks, and/or the like, which may be managed by a separate namespace layer (not shown). The mapping layer 160 maps each data object to a corresponding set of block virtualization structures ("BVSs") in the virtualization layer 170. In some examples, one BVS is provided for each addressable data block in the storage system. The mapping layer 160 includes indirect blocks ("IBs") 162. Each IB 162 is a block that contains an array of block pointers, such as 1024 block pointers. In an example, IBs 162 are arranged in a tree, or in multiple trees, in which block pointers in parent IBs point to child IBs and thus multiply the total number of BVSs (and therefore data blocks) that can be addressed.

In the virtualization layer 170, the BVSs enable the data storage system 116 to deduplicate physical data blocks and to relocate physical data blocks without having to update block pointers in the mapping layer 160. Block pointer updates would be a very burdensome task, given that block pointers tend to be much more numerous and widely dispersed than are BVSs.

The physical layer 180 manages the physical data blocks of the data storage system 116. For example, the physical layer 180 is denominated in data blocks of uniform size, such as 4 kB, 8 kB, or the like. Each data block is uniquely addressable.

The physical layer 180 is configured to store host data as storage extents in the data blocks. The extents may hold compressed data or uncompressed data. Some extents may be smaller than a block, e.g., if the data are compressed and/or if only a portion of a block's data are uniquely stored. One should appreciate that the physical layer 180 is itself a logical structure and that the bits of data are actually stored in devices of the storage 190. The data storage system 116 may include additional layers, which are not shown, such as a RAID (Redundant Array of Independent (or Inexpensive) Disks) layer, additional mapping layers, and the like. The depicted arrangement is intended merely to be illustrative.

In example operation, the hosts 110 issue I/O requests 112 to the data storage system 116. The SP 120 receives the I/O requests 112 at the communication interfaces 122 and initiates further processing. For example, the SP 120 receives sets of incoming data 138 being written by hosts 110 and renders the data in block-sized increments of memory, referred to herein simply as "blocks." The data as received from the hosts is not necessarily block-denominated and may arrive in I/O's of any size. Nevertheless, the data cache 136 may store the arriving data as blocks, which the data cache 136 may realize in buffer caches, for example. The size of the buffer caches is preferably configured to match the block size of the data storage system 116.

To support sub-block data deduplication, the SP 120 defines multiple sub-blocks for the defined blocks. For example, the SP 120 renders block 140 as sub-blocks 140-0 through 140-7, which are contiguous and uniformly sized. The inventors have recognized that a sub-block size of 512 B (one sector) is particularly well-suited for sub-block deduplication, as many host applications use the sector as a standard size for performing writes. Although host applications may shift data when writing to the data storage system 116, such shifts tend to appear in full-sector increments. Performing deduplication at per-sector granularity thus catches many shifted sectors that conventional, block-based deduplication would miss. Setting the sub-block size to something different from a sector is not excluded from processing described herein.

With the sub-blocks 140-0 through 140-7 defined, a deduplication attempt begins by attempting to match one or more the sub-blocks to an entry in the dedupe database 150. For example, the dedupe manager 132 receives a candidate sub-block 140C of the candidate block 140 and generates a digest of the candidate sub-block 140C, e.g., by applying a hash function to the contents of sub-block 140C. The dedupe manager 132 then searches the dedupe database 150 for a digest D that matches the computed digest of sub-block 140C. In a non-limiting example, the dedupe database 150 is constructed as a key-value store, where the digest D forms the key and the reference Ref and position Pos form the value. In such cases, searching for a matching entry in the dedupe database 150 merely entails looking up the value that corresponds to the digest which is applied as the key. If no match is found, the dedupe manager 132 may try a different sub-block of candidate block 140. If no match is found after attempting all sub-blocks 140-0 through 140-7, then the deduplication attempt fails for the candidate block 140. The SP 120 may then allocate a new storage extent from the physical layer 180 and store the contents of the candidate block 140 in the newly allocated extent.

If the dedupe manager 132 succeeds, however, in finding a matching entry 152 to the candidate sub-block 140C, then deduplication proceeds. In an example, the matching entry 152 is the entry in the dedupe database 150 for which the digest $D_T$ matches the computed digest of the candidate sub-block 140C. The digest $D_T$ itself was computed for an earlier processed sub-block, which we refer to as a "target sub-block," and was part of an earlier-processed data block, which we refer to as a "target block."

The dedupe manager 132 then follows the reference $Ref_T$ in the matching entry to obtain the target block, which may still reside in the data cache 136 or which may be fetched from storage 190 if it does not. Depending on implementation, the deduplication attempt may fail if there is a cache miss, as fetching the target block from disk may be too time-consuming to be warranted.

Assuming the target block is obtained, the dedupe manager 132 may proceed by confirming the match. For example, the dedupe manager 132 compares the candidate sub-block 140C with the target sub-block as read from the target block and tests whether the two are the same, e.g., by performing a data comparison. Note that the matching entry 152 indicates, via $P_{OST}$, the position of the target sub-block in the target block. Thus, the comparison may proceed without having to scan the entire target block.

Assuming the match is confirmed, the dedupe manager 132 may identify the full extent of the match. For example, a match to the target sub-block may be part of a larger match between the candidate block 140 and the target block. Given the position, $P_{OST}$, of the target sub-block in the target block, the dedupe manager 132 selects a direction in which to search for an extended match. For instance, if the target sub-block was the first block in the target block, then the search should proceed in the forward direction. But if the target sub-block was the last block in the target block, the search should proceed in the reverse direction. The dedupe manager 132 proceeds in the indicated direction, comparing bytes of the candidate block 140 with corresponding bytes of the target block, until an end of the candidate block 140 is reached or until the bytes of the two blocks no longer match. The dedupe manager 132 then identifies a boundary between a duplicate range of the candidate block, $R_{DUP}$, which is shared with a target range $R_{TARG}$ of the target block, and a unique range of the candidate block $R_{UQ}$, which is unique to the candidate block 140. Some block comparisons may yield two unique ranges, one before the duplicate range $R_{DUP}$ and one after.

Next, the dedupe manager 132 effects persistent storage of the candidate block 140, in a manner that efficiently accounts for both the duplicate range $R_{DUP}$ and the unique range $R_{UQ}$ (or unique ranges). In the example shown, the data storage system 116 has already stored the target block, along with metadata to support it. For example, SP 120 already configured a block pointer 164T in a leaf IB 162T in the mapping layer 160. The block pointer 164T is already configured to point to $BVS_T$ in the virtualization layer 170. $BVS_T$ in turn points to $Extent_T$, which stores the target block in the physical layer 180. Now, to support storage of the candidate block 140, the mapping layer 160 configures a block pointer 164C in leaf IB 162C. The block pointer 164C points to BVSc, which is made to point to two different locations. The first location is the address of $Extent_C$, which is designated for storing the unique range (or ranges), $R_{UQ}$, of the candidate block. The second location is the address of $BVS_T$, i.e., the BVS that points to the target block and contains the duplicate range, $R_{DUP}$. When pointing to $BVS_T$, the metadata in $BVS_C$ may specify the range $R_{TARG}$ of the target block that contains the shared data, such as by offset and length. The SP 120 may then store the unique range $R_{UQ}$ in $Extent_C$. The stored data may be compressed, if desired.

The described operations thus effect storage of the candidate block 140 while consuming only the amount of storage space required to support the unique range, $R_{UQ}$, which may be as small as a single sector, or smaller if compressed. Some additional metadata may be needed, but the additional metadata is small compared with the amount of storage space conserved. In a conventional, block-based deduplication scheme, the unique range $R_{UQ}$ would have precluded any match to a previous block, so the entire block would have to have been stored, which would have been up to eight times the amount of data that is stored in the current example.

One significant feature of the described technique is that it combines digest-based lookups of sub-blocks with data comparisons of data. In some circumstances, this arrangement allows data to be deduplicated at levels even smaller than the size of a sub-block. For example, when comparing the candidate block 140 with the target block, the dedupe manager 132 may operate with arbitrarily high precision. Thus, the dedupe manager 132 can identify boundaries between duplicate ranges and unique ranges with precision as high as a single byte.

Because the described technique uses data comparisons as part of its processing, the act of confirming that there are no hash collisions is a simple matter, as the target block and candidate block are already being compared. Some embodiments leverage this feature by using relatively small digests in the dedupe database 150, such as digests having fewer than 128 bits. Although long digests can reduce the risk of hash collisions to nearly zero, they are complex to compute and can place high burdens on processor cores. As the disclosed technique compares the blocks as part of its regular processing, the technique is tolerant to hash collisions. Should a hash collision (false positive match) occur, the collision will be detected by data comparison and treated as a non-match. In such cases, the dedupe manager 132 can simply try again or move on to the next sub-block of the candidate block, attempting to match that one.

Also, one of ordinary skill in the art will appreciate that sub-block deduplication is also capable of matching entire blocks. For instance, if a data comparison of a candidate block to a target block results in a duplicate range $R_{DUP}$ the size of the entire block, with a unique range $R_{UQ}$ of zero size, then the entire block is matched and no unique range needs to be stored.

One might observe that sub-block duplication generally requires a greater number of digest lookups than does block-based deduplication. However, the use of smaller digests can help to offset the increased number of lookups. Also, implementations may limit the cost of lookups where no match is found by using Bloom filters, for example.

Although data comparisons are the general rule, it can be avoided in some circumstances. For instance, if the candidate sub-block is in the first position of the candidate block (like sub-block 140-0), and the position indicator $P_{OST}$ of the matching entry 152 indicates the last position in the target block, then the match cannot be extended as there is no possibility of there being additional shared content. The match would thus be limited to the matching sub-block, and a data comparison is avoided.

The dedupe manager 132 may also play a role in loading the dedupe database 150 with new content. For instance, as the data cache 136 receives new host data and defines new blocks, the dedupe manager 132 may access those blocks and create new database entries for one or more of their sub-blocks. Creating new entries for all sub-blocks of each newly defined block is certainly an option, but we have recognized that it is generally sufficient to create entries for only the first and the last sub-blocks, e.g., 140-0 and 140-7. In the example shown, the dedupe manager 132 has created new database entries for sub-blocks 140-0 and 140-7. Each entry includes a digest hash of the respective sub-block ($D_{C0}$ or $D_{C7}$), a position (0 or 7) of the respective sub-block in the candidate block 140, and a reference Refc to the candidate block 140, which may be a pointer to the buffer cache that stores the candidate block 140 in the data cache 136.

A rationale behind limiting new database entries to first and last sub-blocks is that data shifts (by sector increments) may be common, but data inserts may be expected to be relatively rare. Recording entries for the first and last sub-blocks ensures that shifted data will produce at least one sub-block match. In some cases, new sub-block entries are avoided for sub-blocks that are already recorded in entries of the dedupe database 150.

Figure 2A:
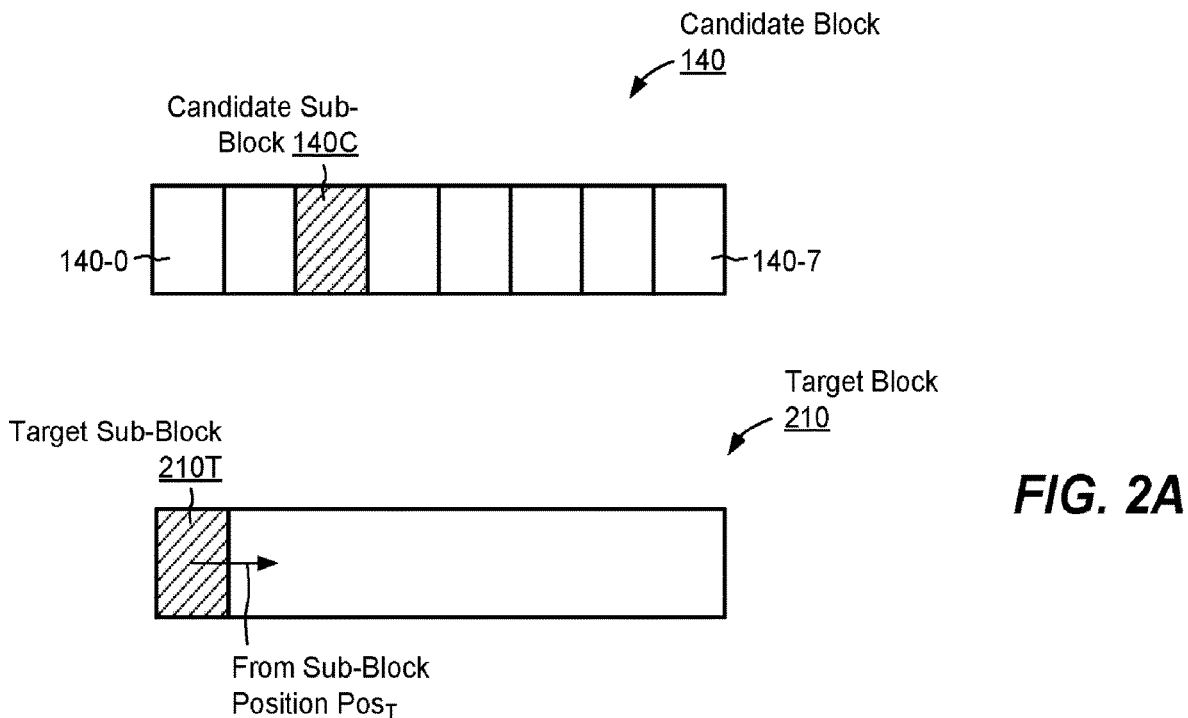
FIGS. 2A and 2B are diagrams that show an example sequence for identifying a duplicate range and a unique range of a candidate block when a candidate sub-block has matched to a target sub-block that occupies a first position of a target block.
Figure 2B:
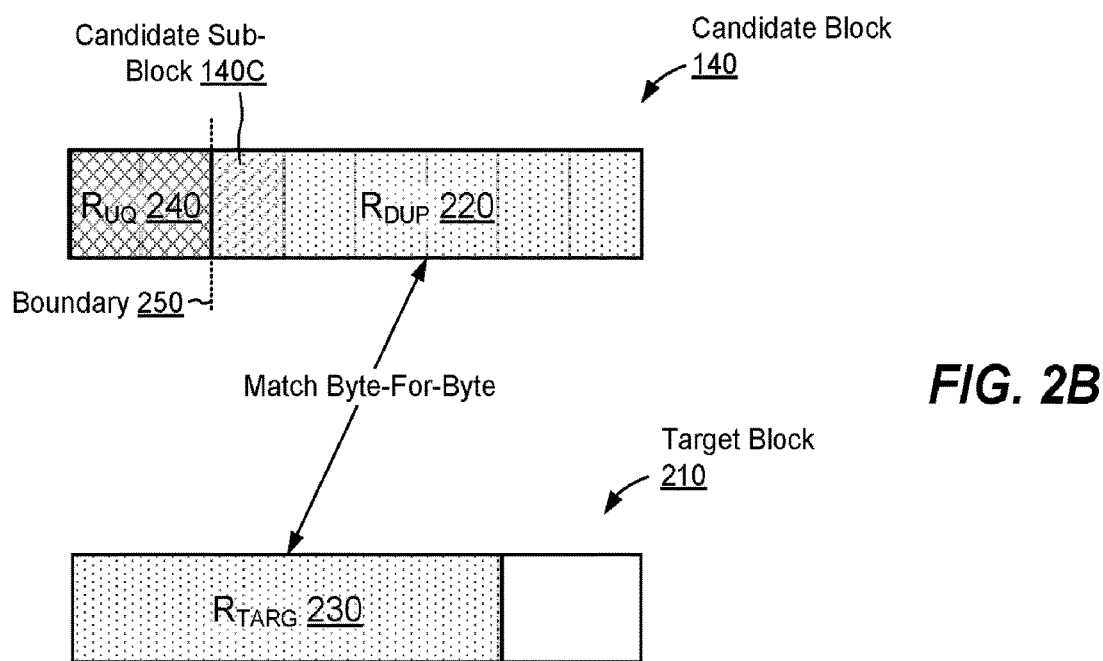

Referring to FIGS. 2A and 2B, shown is an example sequence for deduplicating a portion of candidate block 140 when candidate sub-block 140C has been matched to a target sub-block 210T in a first position of a target block 210. As shown in FIG. 2A, the value of $P_{OST}$ in the matching entry 152 has identified the target sub-block 210T as being in the first position of the target block 210, which indicates a forward search direction through the candidate block 140.

The dedupe manager 132 proceeds to search in the forward direction through the candidate block, starting with the candidate sub-block 140C (or the forward end of it, e.g., if a hash collision has been ruled out). As the dedupe manager 132 advances through the candidate block 140, it advances correspondingly through the target block 210, comparing data of the candidate block 140 with data of the target block 210 at a level of granularity smaller than the size of a sub-block. For instance, comparisons may proceed in 16-byte chunks, in 8-byte chunks, in 1-byte chunks, or in any-sized chunks are best suited to the implementation.

At some point, the dedupe manager 132 either detects a mismatch or reaches the forward end of the candidate block 140. In this example, no mismatch is detected and, as shown in FIG. 2B, the dedupe manager 132 identifies a duplicate range $R_{DUP}$ 220 in the candidate block 140 and a corresponding target range $R_{TARG}$ 230 in the target block 210. These ranges match byte-for-byte and are exact duplicates of each other. The dedupe manager 132 also identifies a unique range, $R_{UQ}$ 240, of the candidate block, which does not correspond to any content in the target block 210. A boundary 250 may be identified between the duplicate range $R_{DUP}$ 220 and the unique range $R_{UQ}$ 240. In this case, the boundary 250 aligns with a sub-block boundary, i.e., between sub-blocks 140-1 and 140-2. The dedupe manager 132 then proceeds as already described, by arranging mapping metadata to effect storage of the duplicate range $R_{DUP}$ (by reference to the range $R_{TARG}$ in the target block) and by directing storage of the unique range $R_{UQ}$ in a storage extent in the physical layer 180. This example thus avoids redundant storage of $R_{DUP}$ and saves three quarters of a block.

Figure 3A:
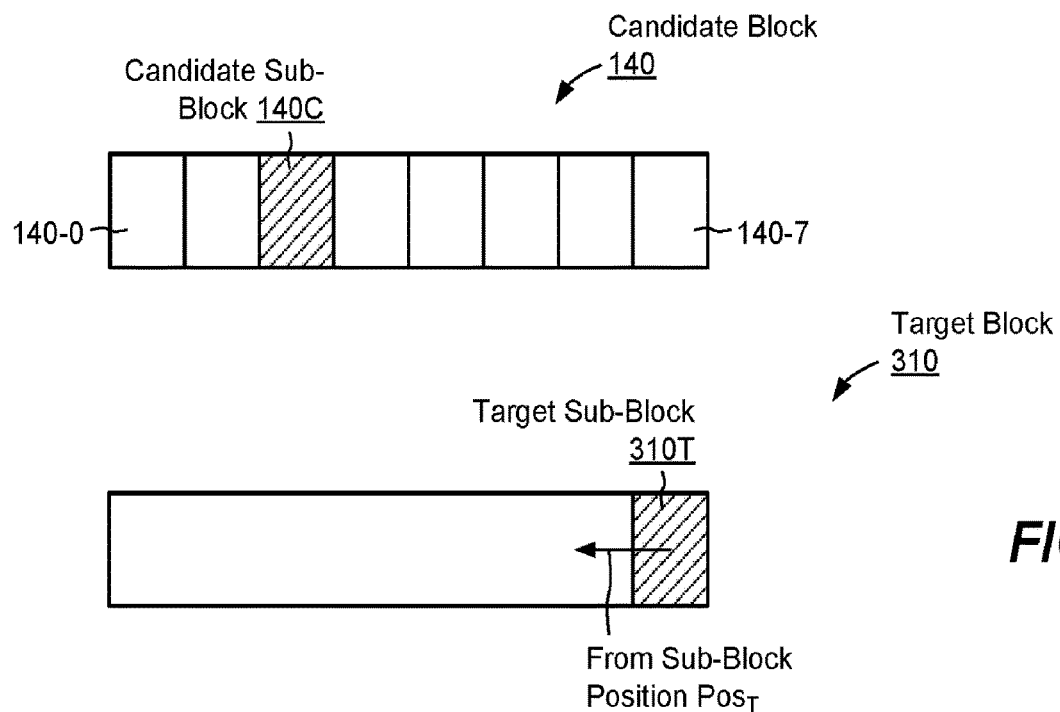
FIGS. 3A and 3B are diagrams that show an example sequence for identifying a duplicate range and a unique range of a candidate block when a candidate sub-block has matched to a target sub-block that occupies a last position of a target block.
Figure 3B:
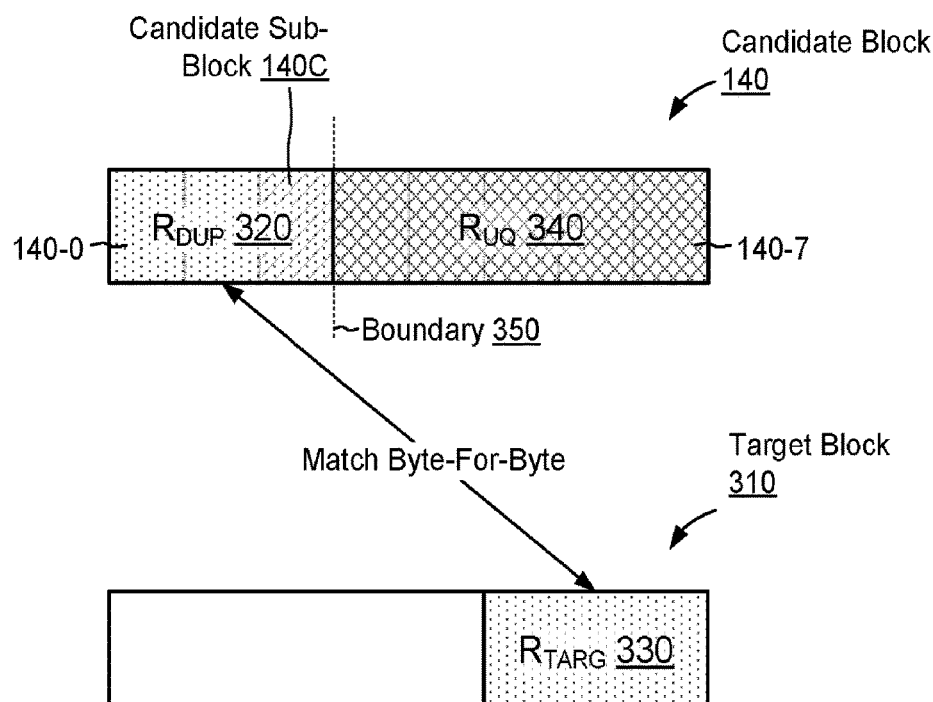

Referring to FIGS. 3A and 3B, shown is an example sequence for deduplicating a portion of candidate block 140 when candidate sub-block 140C has been matched to a target sub-block 310T in a last position of a target block 310. As shown in FIG. 3A, the value of $P_{OST}$ in the matching entry 152 has identified the target sub-block 310T as being in the last position of the target block 310, which indicates a reverse search direction through the candidate block 140. The dedupe manager 132 proceeds to search in the reverse direction through the candidate block, starting with the candidate sub-block 140C (or the back end of it). As the dedupe manager 132 retracts through the candidate block 140, it retracts correspondingly through the target block 310, comparing data of the candidate block 140 with data of the target block 310 at fine granularity. In this example, no mismatch is detected and, as shown in FIG. 3B, the dedupe manager 132 identifies a duplicate range $R_{DUP}$ 320 in the candidate block 140 and a corresponding target range $R_{TARG}$ 330 in the target block 310. The dedupe manager 132 also identifies a unique range, $R_{UQ}$ 340, of the candidate block 140, which does not correspond to any content in the target block 310. A boundary 350 may also be identified between the duplicate range $R_{DUP}$ 320 and the unique range $R_{UQ}$ 340. In this case, the boundary 350 aligns with a sub-block boundary, i.e., between sub-blocks 140-2 and 140-3. The process then proceeds as described above, by arranging mapping metadata to effect storage of the duplicate range $R_{DUP}$ and by directing storage of the unique range $R_{UQ}$ in the physical layer 180. This example saves three eighths of a block.

Figure 4A:
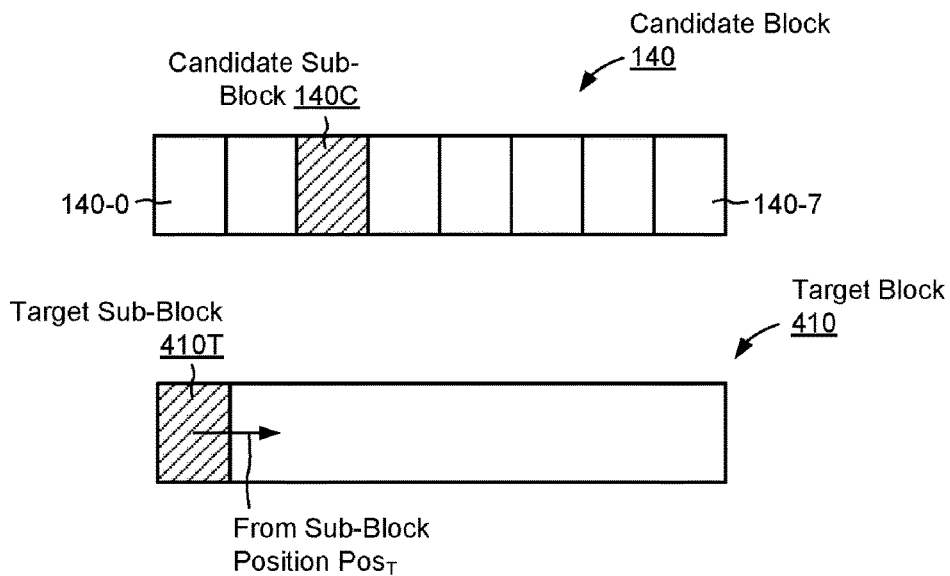
FIGS. 4A, 4B and 4C are diagrams that show an example sequence for identifying a duplicate range and two discontiguous unique ranges of a candidate block when the duplicate range does not extend all the way to an end of the candidate block.
Figure 4B:
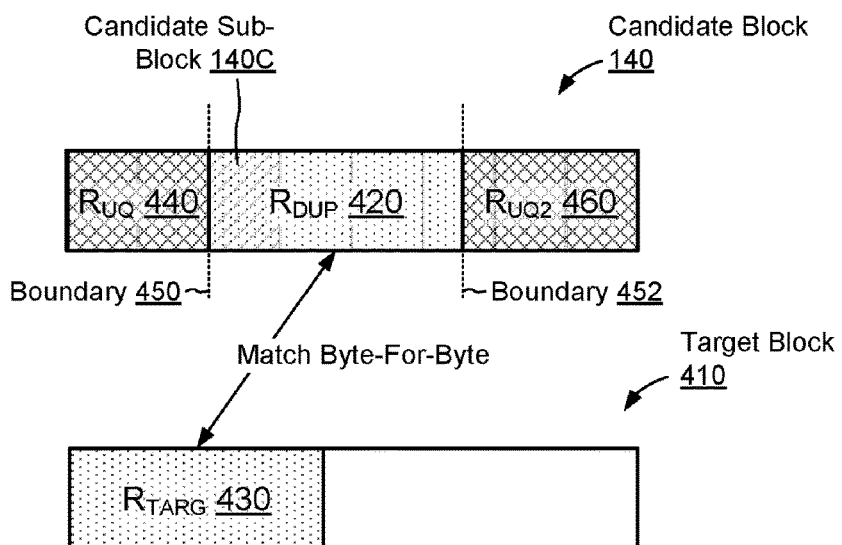

Referring to FIGS. 4A and 4B, shown is a slightly more complex example. As in FIG. 2A, the candidate sub-block 140C has been matched to a target sub-block 410T in a first position of a target block 410. But here, the comparison between candidate block 140 and target block 410 has yielded a mismatch. Rather than extending all the way to the end of the candidate block 140, as in FIG. 2B, the duplicate range $R_{DUP}$ 420 ends at boundary 452. Beyond this point, the contents of the two blocks diverge. The boundary 452 does not align with any boundary between sub-blocks but can rather be found at some byte location relative to the fifth sub-block, 140-5.

As shown in FIG. 4B, three distinct ranges are formed: a duplicate range $R_{DUP}$ 420; a first unique range $R_{UQ}$ 440; and a second unique range $R_{UQ2}$ 460. Boundary 450 separates $R_{DUP}$ from $R_{UQ}$, and boundary 452 separates $R_{DUP}$ from $R_{UQ2}$. Range $R_{DUP}$ 420 matches target range $R_{TARG}$ 430 byte-for-byte.

Figure 4C:
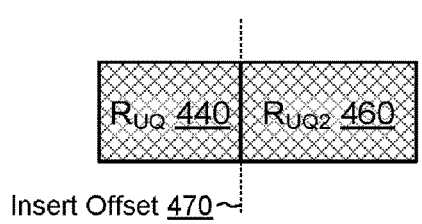

As shown in FIG. 4C dedupe manager 132 may combine the two unique ranges, $R_{uQ}$ 440 and $R_{uQ2}$ 460, by placing them adjacently, while specifying an insert offset 470 to identify their boundary. The insert offset range 470 is so named as it identifies the location at which the contents of $R_{DUP}$ 420 is to be inserted when the candidate block 140 is reconstructed, e.g., when a later read request arrives. In an example, the SP 120 stores the insert offset 470 in mapping metadata for the candidate block 140. Although not addressed previously, the examples in FIGS. 2A/2B and 3A/3B may also involve specifying an insert offset, which in those examples would indicate whether the duplicate range $R_{DUP}$ is to be inserted before or after the unique range, $R_{UQ}$, when reconstructing the respective candidate blocks.

Figure 5A:
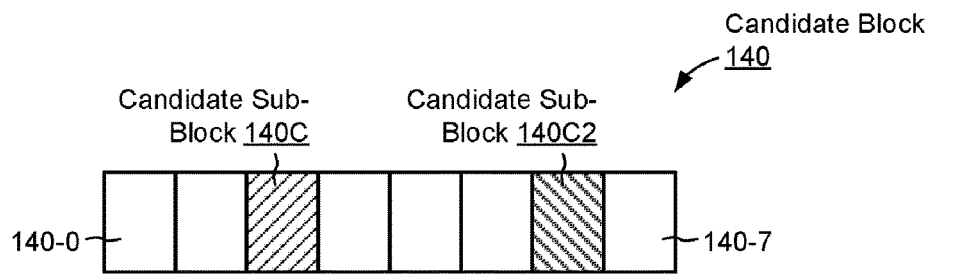
FIGS. 5A and 5B are diagrams that show an example sequence for identifying two duplicate ranges and a unique range of a candidate block when two candidate sub-blocks have matched to two different target blocks.
Figure 5A:
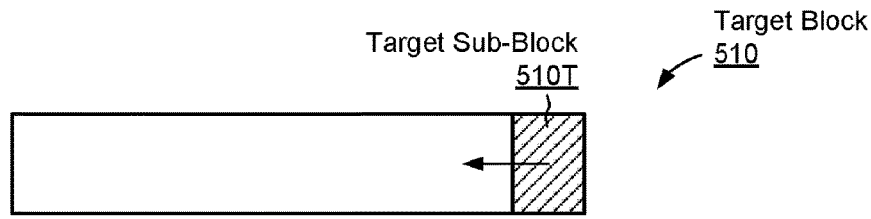
Figure 5A:
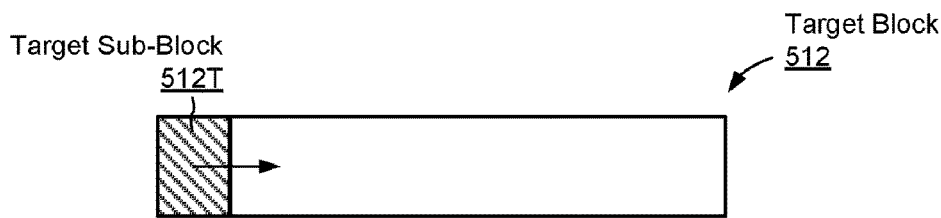
Figure 5B:
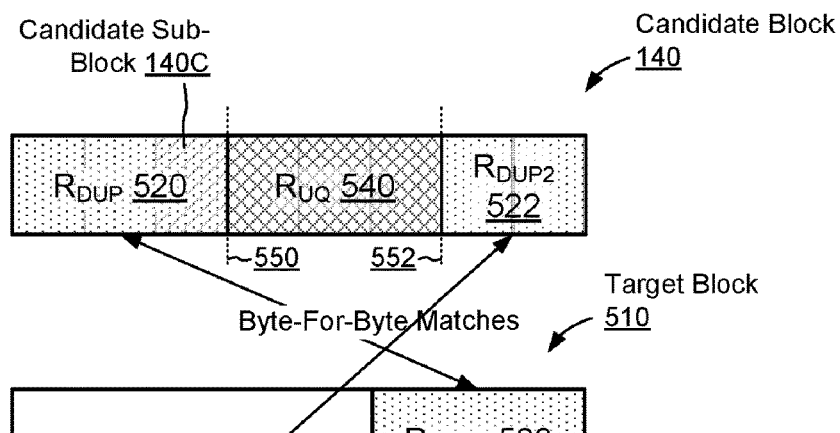
Figure 5B:
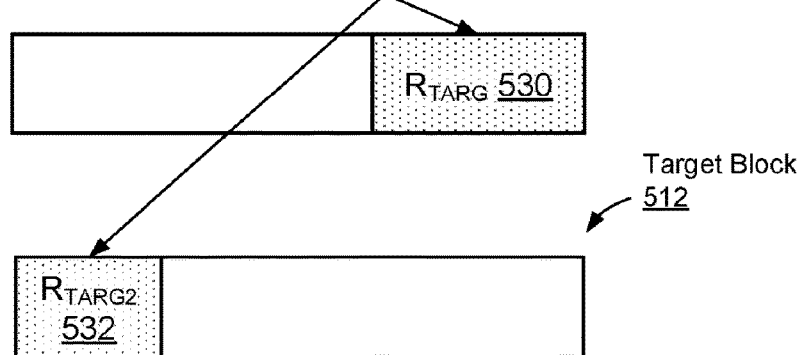

Referring to FIGS. 5A and 5B, shown is a slightly more complex example still. As shown in FIG. 5A, two candidate sub-blocks, 140C and 140C2, of the candidate block 140 have produced respective matches to two different entries in the digest database 150. In this example, the different matches reference different target blocks 510 and 512. In particular, candidate sub-block 140C has matched target sub-block 510T, which occupies the last position in target block 510, and candidate sub-block 140C2 has matched target sub-block 512T, which occupies the first position of target block 512. As shown in FIG. 5B, the dedupe manager 132 has identified two duplicate ranges, $R_{DUP}$ 520 and $R_{DUP2}$ 522, with a single unique range $R_{UQ}$ 540 separating the two duplicate ranges. Duplicate range $R_{DUP}$ 520 matches, byte-for-byte, target range $R_{TARG}$ 530 in target block 510, and duplicate range $R_{DUP2}$ 522 matches, byte-for-byte, target range $R_{TARG}$ 532 in target block 512. Boundaries 550 and 552 separate the ranges of the candidate block 140 in the manner shown. As usual, the process stores the unique range $R_{UQ}$ 540 in a storage extent in the physical layer 180.

The presence of two duplicate ranges may necessitate the creation of additional metadata, as BVSc of the candidate block 140 must point to two different target ranges 530 and 532 in two different target blocks 510 and 512. Two insert offsets may be specified, as well, to indicate where each duplicate range is to be inserted relative to the unique range.

Figure 6A:
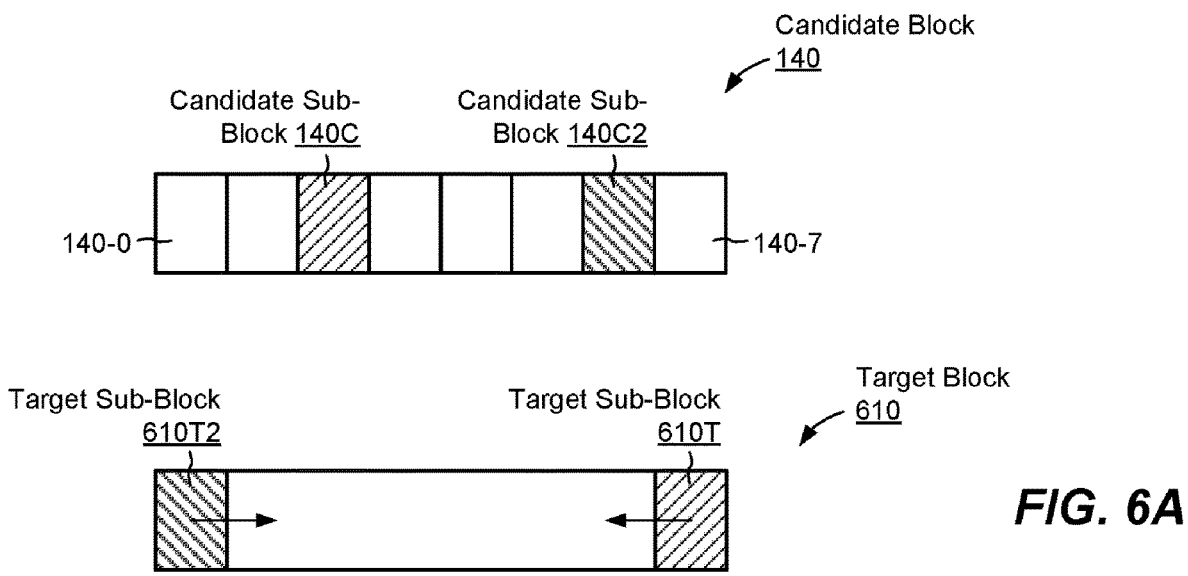
FIGS. 6A and 6B are diagrams that show an example sequence for identifying two duplicate ranges and a unique range of a candidate block when two candidate sub-blocks have matched to two distinct ranges of a single target block.
Figure 6B:
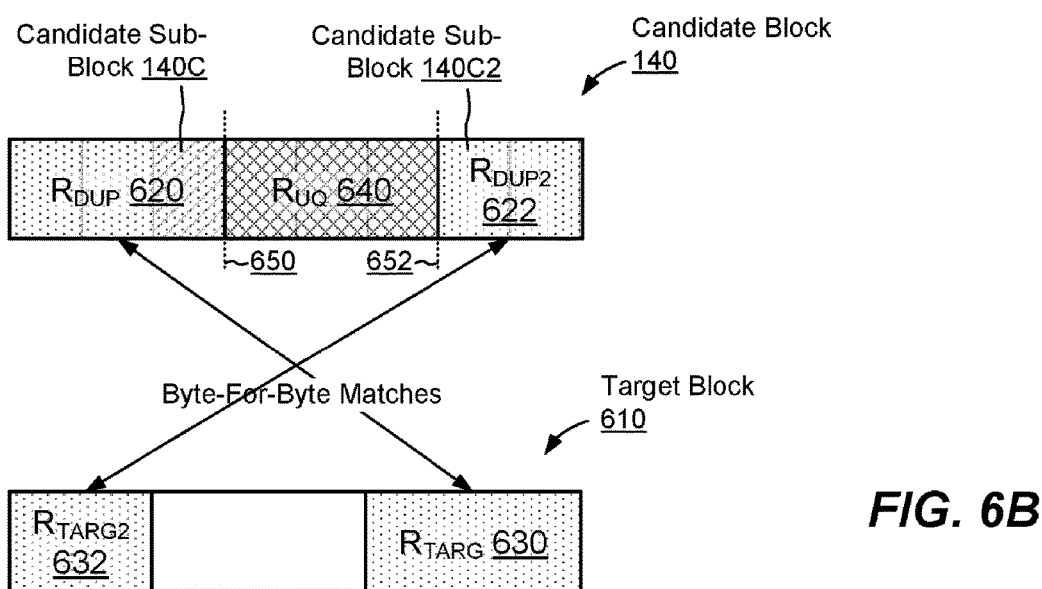

Referring to FIGS. 6A and 6B, shown is yet another example. This example is similar to the one shown in FIGS. 5A and 5B, but here two target sub-blocks 610T and 610T2 are found within the same target block 610, rather than in two different target blocks. Candidate sub-block 140C has matched to target sub-block 610T, and candidate sub-block 140C2 has matched to target sub-block 610T2. As shown in FIG. 6B, two duplicate ranges are formed, $R_{DUP}$ 620 and $R_{DUP2}$ 622, which match, respectively, with target ranges $R_{TARG}$ 630 and $R_{TARG2}$ 632. A single unique range $R_{UQ}$ 640 is formed in the candidate block 140 between the two duplicate ranges, with boundaries 650 and 652 identified as shown. Unique range $R_{UQ}$ 640 may be stored in the usual way. BVSc of the candidate block 140 must now point to two different target ranges 630 and 632 in the target block 610, which may require two different insert offsets.

Figure 7:
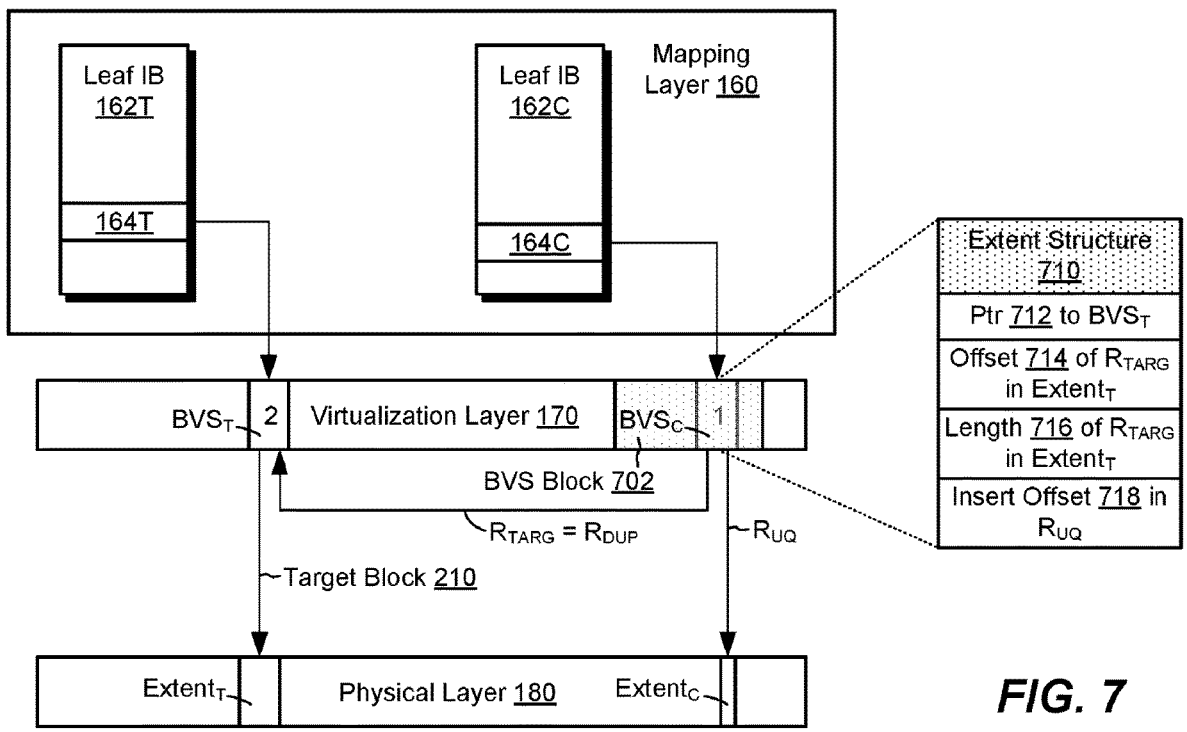
FIG. 7 is a block diagram of an example arrangement where mapping metadata is provided in a virtualization layer for supporting deduplication at sub-block granularity.

FIG. 7 shows the example metadata structures of FIG. 1 in additional detail. Here, it is seen that BVSc, which is provided for mapping the candidate block 140, is located within a BVS block 702. In some examples, BVS block 702 may include a large number of BVSs. Each BVS has a reference count, which tracks the number of block pointers that point to the respective BVS. For instance, BVSc has a reference count of one, because only one block pointer, pointer 164C in leaf IB 162C, points to it. BVST, which is provided for mapping the target block 210, has a reference count of two, reflecting the fact that both block pointer 164T in leaf IB 162T and a pointer in BVSc point to it.

As shown to the right of FIG. 7, BVSc stores an extent structure 710. The extent structure 710 is metadata that references a range of data in the current block within the data of another block. For example, BVSc supports mapping for a particular logical address of a particular data object hosted by the data storage system 116, and BVSc resolves that logical address into a first pointer to the unique range $R_{UQ}$ and a second pointer to the duplicate range $R_{DUP}$. Here, the first pointer of BVSc points to Extent$_C$ and the second pointer, which is provided within the extent structure 710, points to the target range $R_{TARG}$ of the target block 210. Example metadata elements of the extent structure 710 include the following:

Pointer 712. An address of BVS$_T$, the BVS of the target block where the duplicate range resides in the virtualization layer 170.

Offset 714. Offset of the target range $R_{TARG}$ in Extent$_T$. Used for locating the starting location of $R_{TARG}$, which matches $R_{DUP}$.

Length 716. The length of the target range $R_{TARG}$ in Extent$_T$. The offset 714 and length 716 together fully identify the target range $R_{TARG}$ within Extent$_T$, which is itself fully identified by the pointer 712.

Insert Offset 718. An offset relative to the unique range $R_{UQ}$ in Extent$_C$ where the contents of the duplicate range $R_{DUP}$ are to be inserted when reconstituting the candidate block 140.

One should appreciate that an extent structure 710 is required only in cases where some of the contents that would normally be contained in an extent pointed to by a BVS have been deduplicated, such that those contents reside in a different physical extent from the one pointed to by that BVS. Thus, only some BVSs will use extent structures 710, whereas others do not. In addition, some BVSs may employ multiple extent structures 710. The examples presented in FIGS. 5A/5B and 6A/6B would each require two extent structures 710, one for identifying each of the two duplicate ranges presented in each example. Further, one should appreciate that the placement of extent structures 710 in the mapping metadata may be varied.

Figure 8:
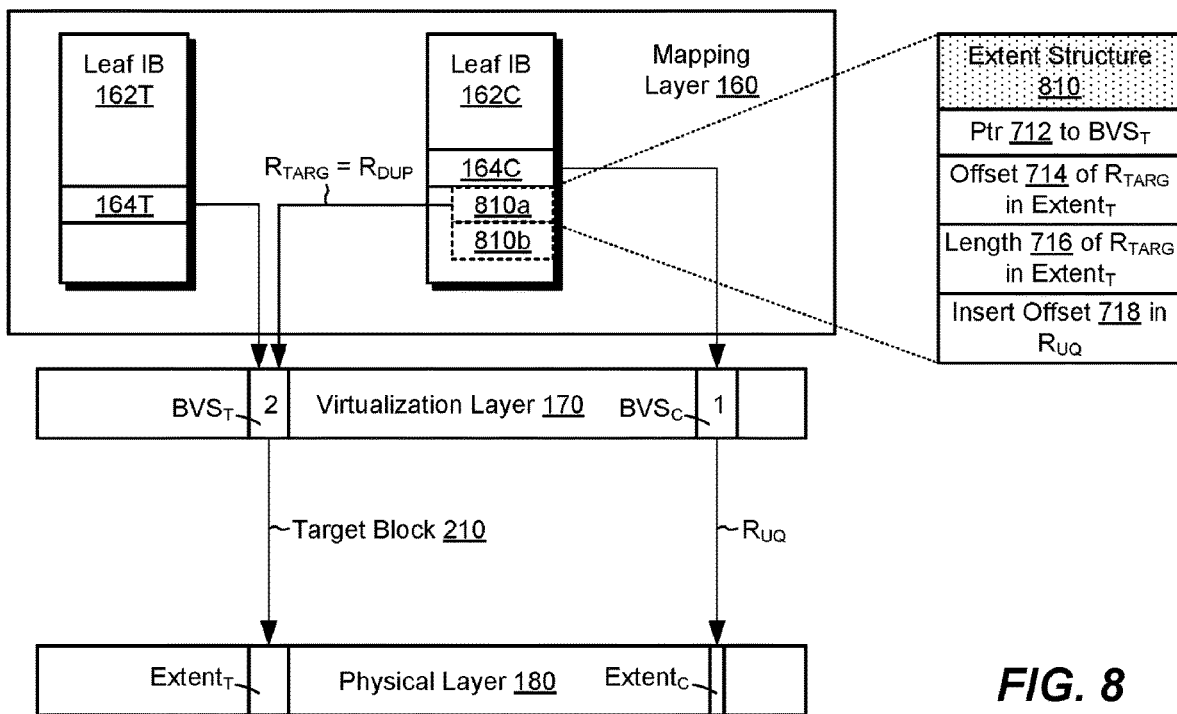
FIG. 8 is a block diagram of an example arrangement where mapping metadata is provided in a mapping layer for supporting deduplication at sub-block granularity.

FIG. 8 shows another example of an extent structure. Rather than being located in BVS$_C$, as was the case in FIG. 7, the extent structure 810 is instead located in leaf IB 162C. Placing the extent structure 810 in the leaf IB has the inherent advantage of avoiding multiple hops. In FIG. 7, for example, the SP 120 would have to access BVSc, read its extent structure 710, and then access BVS$_T$. Those accesses would have to be performed in order, one after the other. By contrast, locating the extent structure 810 in the leaf IB, as shown in FIG. 8, allows the SP 120 to access both BVSc and BVS$_T$ in parallel, promoting faster processing.

Between zero and two extent structures are needed for each leaf-IE block pointer, with two extent structures shown here as structures 810a and 810b. As the leaf IB is itself a block, which has limited space, it may be preferable in some examples to compress the contents of the leaf IB when many extent structures 810 are needed. Each leaf IB 162 includes a header and an array of block pointers. In an example, the header is marked with a label that identifies the pointers as compressed or uncompressed, and the array of block pointers (but not the header) is compressed, along with the associated extent structures 810. In this manner, ample space may be made available for any required number of extent structures 810.

Figure 9:
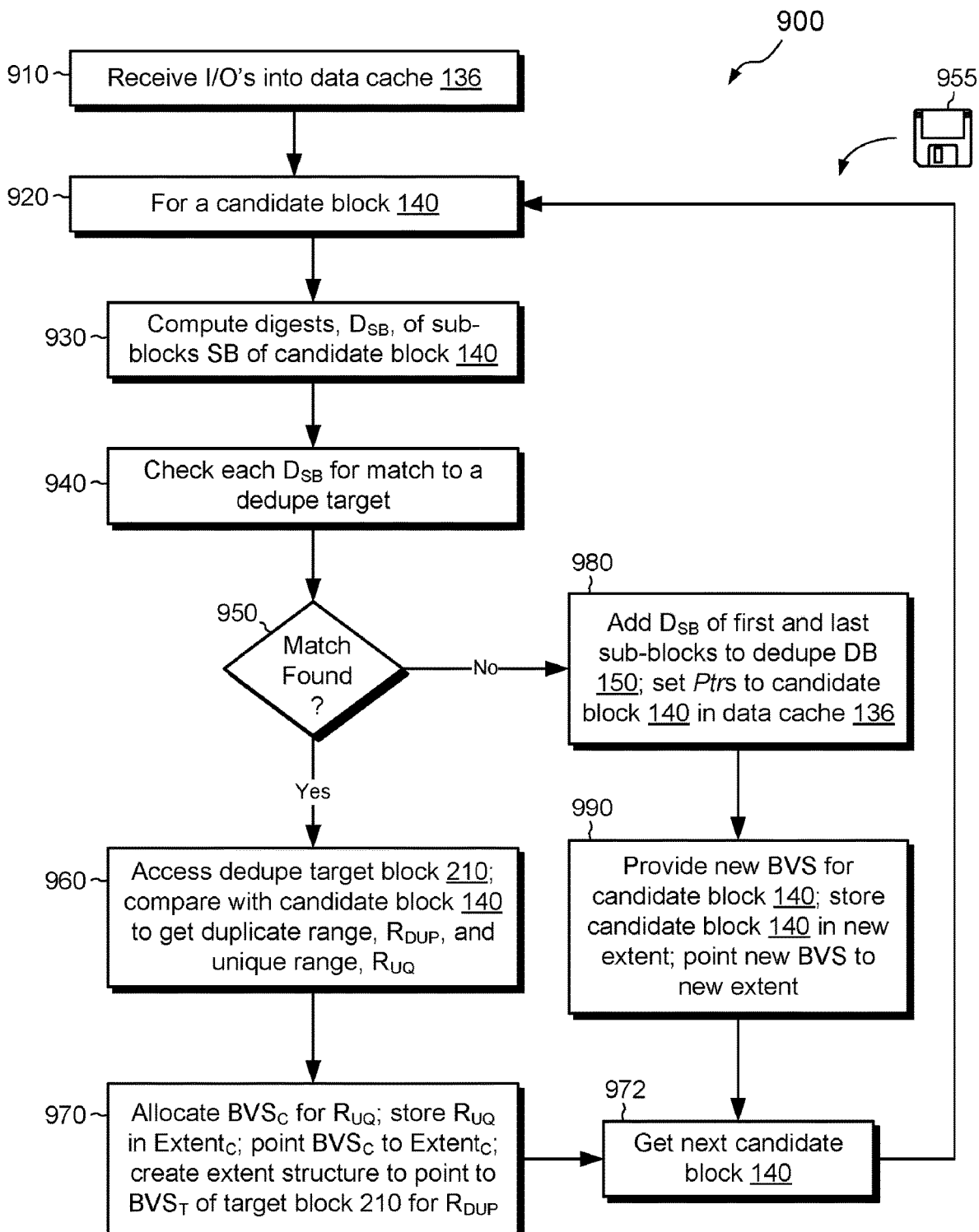
FIG. 9 is a flowchart that shows an example method of processing I/O write requests in the environment of FIG. 1.
Figure 10:
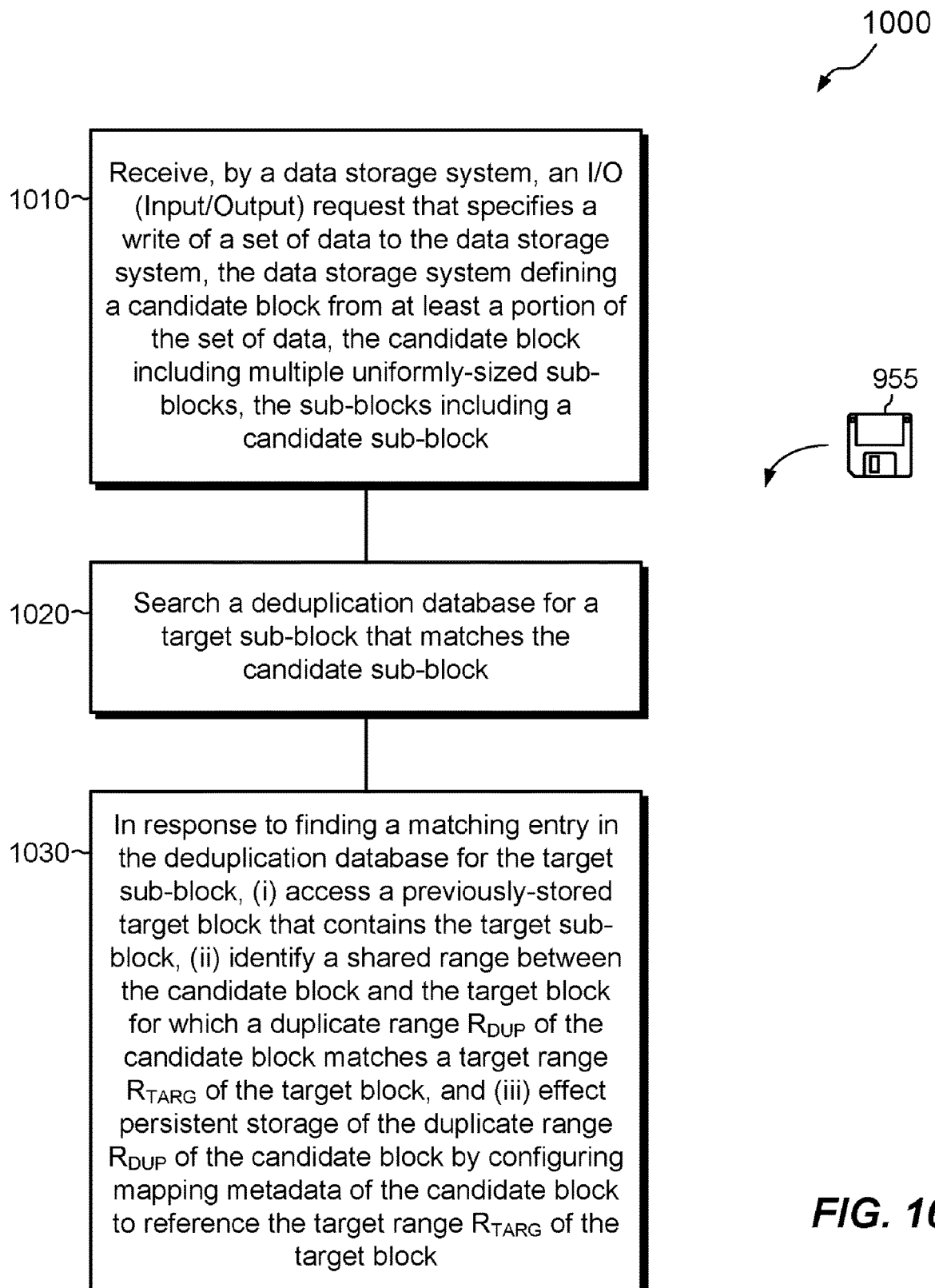
FIG. 10 is a flowchart that shows an example method of performing data deduplication in the environment of FIG. 1.

FIGS. 9 and 10 show flowcharts of processing steps or methods 900 and 1000 that may be carried out in connection with the environment 100. The methods 900 and 1000 are typically performed, for example, by the software constructs described in connection with FIG. 1, which reside in the memory 130 of the storage processor 120 and are run by the set of processors 124. The various acts of methods 900 and 1000 may be ordered in any suitable way. Accordingly, embodiments may be constructed in which acts are performed in orders different from those illustrated, which may include performing some acts simultaneously.

FIG. 9 shows example method 900 of performing inline deduplication at sub-block granularity. At 910, the SP 120 receives sets of data specified in write I/O requests 112 into the data cache 136. The data cache 136 stores the data in block-size buffer caches (blocks). Each such block includes multiple sub-blocks such as sub-blocks 140-0 to 140-7.

At 920, the dedupe manager 132 obtains a candidate block 140 from the data cache 136 and performs various acts relating to deduplication of the candidate block 140. For example, at 930, the dedupe manager 132 computes digests of at least one, but preferably all, sub-blocks 140-1 to 140-7 of the candidate block 140. At 940, the dedupe manager 132 searches the dedupe database 150 for each computed digest. At 950, if a match is found, operation proceeds to 960, whereupon the dedupe manager 132 accesses the target block 210 (or any of the other target blocks described above), by following the reference Ref$_T$ in the matching entry 152. The dedupe manager 132 then compares the candidate block 140 with the target block 210 and identifies the duplicate range R$_{DUP}$ of the candidate block 140, which contains the same data as the corresponding target range R$_{TARG}$ of the target block 210. The dedupe manager 132 also identifies a unique range R$_{UQ}$ of the candidate block 140.

With the duplicate range R$_{DUP}$ and the unique range R$_{UQ}$ identified, operation proceeds to 970, whereupon the SP 120 allocates BVSc for the candidate block 140, stores R$_{UQ}$ in Extent$_C$, and points BVSc to R$_{UQ}$. The SP 120 also effects storage of R$_{DUP}$ by reference, by creating an extent structure 710 (or 810) that points to range R$_{TARG}$ of the target block 210, e.g., by pointing to BVS$_T$ (via pointer 712), specifying the offset 714 and length 716 of R$_{TARG}$ in Extent$_T$, and specifying an insert offset 718 that identifies where R$_{DUP}$ is to be inserted relative to R$_{UQ}$ when reconstructing the candidate block 140. If two distinct duplicate ranges are detected, two extent structures 710 (or 810) may be created. In this manner, the data storage system 116 accounts for and can later access all the data of the candidate block 140 without having to store the duplicate range R$_{DUP}$. At 972, a next candidate block 140 is obtained and the operation described in steps 920-970 is repeated for the new candidate block. Although candidate blocks may be processed serially, as shown, they may also be processed in parallel, e.g., with multiple threads processing respective candidate blocks simultaneously.

Returning to 950, if no match is found to any of the sub-blocks 140-1 to 140-7 of the candidate block 140, operation proceeds to 980, whereupon the dedupe manager 132 creates new entries in the dedupe database 150 for the first and last sub-blocks of the candidate block 140. Creating new entries includes establishing pointers Ptr in each new entry to the candidate block 140 in the data cache 136.

At 990, the SP 120 stores the candidate block 140, without performing deduplication, by providing a new BVS for the candidate block 140, storing the candidate block 140 in a new storage extent, and pointing the new BVS to the new storage extent. Data may be stored in compressed or uncompressed form.

Referring to FIG. 10, shown is a method 1000 of performing data deduplication and summarizes some of the improvements described above. At 1010, a data storage system 116 receives an I/O (Input/Output) request 112 that specifies a write of a set of data 138 to the data storage system. The data storage system 116 defines a candidate block 140 from at least a portion of the set of data 138. The candidate block includes multiple uniformly-sized sub-blocks, e.g., 140-0 to 140-7, and the sub-blocks include a candidate sub-block 140C.

At 1020, a deduplication database 150 is searched for a target sub-block that matches the candidate sub-block 140C. For example, the dedupe manager 132 computes a digest of the candidate sub-block 140C and searches the dedupe database 150 for a matching entry.

At 1030, in response to finding a matching entry 152 in the deduplication database 150 for the target sub-block (e.g., 210T, 310T, etc.), (i) accessing a previously-stored target block (e.g., 210, 310, etc.) that contains the target sub-block, (ii) identifying a shared range between the candidate block 140 and the target block for which a duplicate range R$_{DUP}$ of the candidate block matches a target range R$_{TARG}$ of the target block, and (iii) effecting persistent storage of the duplicate range R$_{DUP}$ of the candidate block 140 by configuring mapping metadata (e.g., 710, 810) of the candidate block 140 to reference the target range R$_{TARG}$ of the target block.

An improved technique has been described for performing data deduplication, which operates at the sub-block granularity by searching a deduplication database 150 for a match between a candidate sub-block 140C of a candidate block 140 and a target sub-block of a previously-stored target block. When a match is found, the technique identifies a duplicate range R$_{DUP}$ shared between the candidate block and the target block and effects persistent storage of the duplicate range R$_{DUP}$ by configuring mapping metadata of the candidate block 140 so that it points to the duplicate range R$_{TARG}$ in the target block.

Although techniques have been described for performing data deduplication inline with I/O requests 112 (e.g., also described in more detail in following paragraphs), similar techniques can be applied when performing deduplication in the background. Background deduplication can proceed substantially as described above, except that the dedupe manager 132 obtains candidate blocks 140 from persistent storage, rather than from incoming I/O requests 112. For example, SP 120 reads a data block from persistent storage, computes digests from sub-blocks of the data block, and searches the dedupe database 150 for a match to one or more of the sub-blocks. If the search reveals a match to a previously-stored target block, the SP 120 identifies a duplicate range $R_{DUP}$ and a unique range $R_{UQ}$ of the candidate block 140, effecting storage of the duplicate range $R_{DUP}$ by configuring metadata (e.g., an extent structure 710 or 810 in a BVS or IB) to reference the corresponding range $R_{TARG}$ in the target block. Also, the SP 120 replaces the storage extent that holds the previously-stored version of the candidate block 140 with a new storage extent that stores only the unique range $R_{UQ}$ of the candidate block 140. The new storage extent may be written in place of the original one, with the residual space being freed, or the unique range $R_{UQ}$ may be written to a newly allocated storage extent in the physical layer 180, with the entirety of the extent holding the original candidate block being freed.

Also, the above description has indicated that certain structures "reference" or "point to" other structures. One should appreciate that any such reference or pointing can be direct or indirect, meaning that intervening pointing structures can also be present. Further, although referenced or pointed-to structures may be identified hereinabove as "blocks," such blocks need not be persistently-stored versions. For example, such blocks may be cached versions of data blocks, or memory-resident structures that have not yet been stored on persistent storage devices.

Further, the extent structures 710 or 810 (or more generally the block level metadata) can be adapted to store additional metadata for tracking small differences between sub-blocks. For instance, a data comparison of a candidate block with a target block that extends beyond the initially-matching candidate and target sub-blocks (such as shown in FIG. 2B) may reveal small differences between adjacent sub-blocks (of candidate and target blocks) being compared, which sub-blocks are almost but not quite identical. Such differences may extend over only a small number of bytes, which could easily fit into available extra space in extent structures or other block level metadata. Thus, additional improvements may identify such minor differences (deltas) and store them in metadata along with a pointer to their locations in the block or sub-block. In this manner, the dedupe match can be extended to include the nearly-matching block or sub-block, which becomes part of the duplicate range $R_{DUP}$ and can thus be deduplicated. During a later read, the SP 120 can reconstruct the block in the usual way and then access the delta from the metadata and insert the delta in place of the duplicate data at the indicated location, thus restoring the difference. Such an embodiment may be useful where small differences in sub-blocks of different data blocks arise merely from timestamps, labels, or minor edits.

Consistent with discussion herein, the data path or I/O path may be characterized as the path or flow of I/O data through a system. For example, the data or I/O path may be the logical flow through hardware and software components or layers in connection with a user, such as an application executing on a host (e.g., more generally, a data storage client) issuing I/O commands (e.g., SCSI-based commands, and/or file-based commands) that read and/or write user data to a data storage system, and also receiving a response (possibly including requested data) in connection with such I/O commands.

The control path, also sometimes referred to as the management path, may be characterized as the path or flow of data management or control commands through a system. For example, the control or management path may be the logical flow through hardware and software components or layers in connection with issuing data storage management command to and/or from a data storage system, and also receiving responses (possibly including requested data) to such control or management commands. Such commands may be, for example, to establish or modify data services, provision storage, perform user account management, and the like. For example, commands may be issued over the control path to provision storage for LUNs, create a snapshot, define conditions of when to create another snapshot, define or establish local and/or remote replication services, define or modify a schedule for snapshot or other data replication services, define a RAID group, obtain data storage management and configuration information for display in a graphical user interface (GUI) of a data storage management program or application, generally modify one or more aspects of a data storage system configuration, list properties and status information regarding LUNs or other storage objects (e.g., physical and/or logical entities in the data storage system), and the like.

The data path and control path define two sets of different logical flow paths. In at least some of the data storage system configurations, at least part of the hardware and network connections used for each of the data path and control path may differ. For example, although both control path and data path may generally use a network for communications, some of the hardware and software used may differ. The data path and control path each define two separate logical flow paths.

An embodiment of a data storage system in accordance with the techniques herein may perform different data processing operations or services on stored user data. For example, the data storage system may perform one or more data reduction operations, such as data deduplication and compression as discussed herein, as well as other types of operations or services. Generally, data deduplication and compression techniques are known in the art and any suitable such technique may be used in an embodiment in accordance with the techniques herein.

In at least one embodiment, the compression technique may be a lossless compression technique such as an algorithm from the Lempel Ziv algorithm family (e.g., LZ77, LZ78, LZW, LZR, and the like). In at least one embodiment in accordance with the techniques herein, data deduplication processing performed may include digest or hash value computation using an algorithm such as based on the SHA-256 hashing algorithm known in the art. Data deduplication generally refers to removing redundant or duplicate data portions. Data deduplication techniques may include looking for duplicate sub-blocks whereby only a single instance of the sub-block is retained (stored on physical storage) and where pointers or references may be used in connection with duplicate or redundant copies (which reference or identify the single stored instance of the data sub-block).

Figure 11:
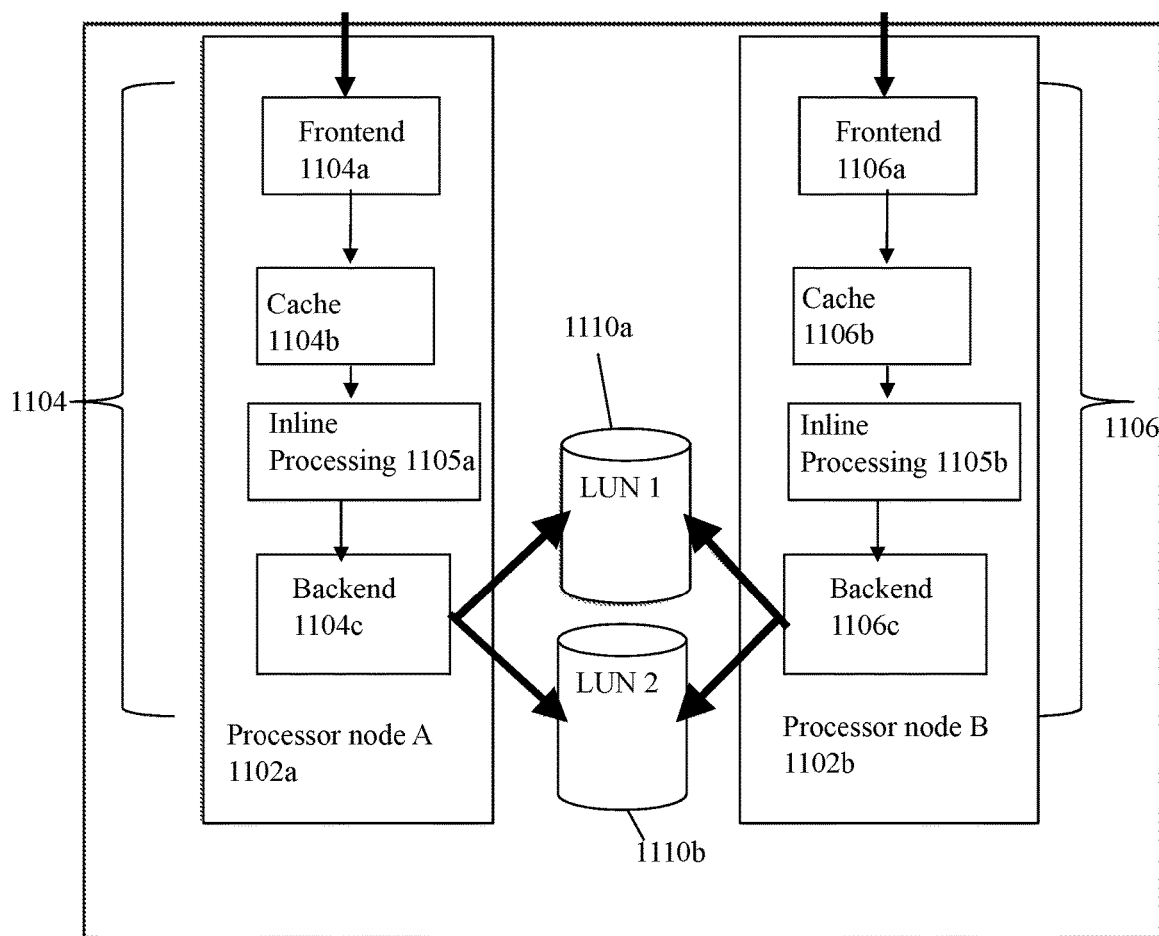
FIG. 11 is an example illustrating in-line processing as may be performed in an embodiment in accordance with the techniques herein.

With reference to FIG. 11, shown is an example 1100 illustrating components that may be included in the data path in at least one existing data storage system in accordance with the techniques herein. The example 1100 includes two processor nodes A 1102a and B 1102b and associated software stacks 1104, 1106 of the data path where I/O requests may be received by either processor node 1102a or 1102b. In the example 1100, the data path 1104 of the processor node A 1102a includes: the frontend (FE) component 1104a (e.g., an FA or front end adapter) that translates the protocol-specific request into a storage system-specific request; a cache layer 1104b (e.g., data cache) where data is temporarily stored; an inline processing layer 1105a; and a backend (BE) component 1104c that facilitates movement of the data between the cache and the permanent non-volatile storage (e.g., back end physical non-volatile storage devices accessed by the BE components such as controllers or device interfaces that access the physical storage). During movement of data in and out of the cache layer 1104b (e.g., such as in connection with reading and writing data respectively, to the physical storage 1110a, 1110b, inline processing may be performed by the layer 1105a. Such inline processing operations of 1105a may be optionally performed and may include any one of more data processing operations in connection with data that is flushed from the cache layer 1104b to the back-end non-volatile physical storage 1110a, 1110b, as well as when retrieving data from the back-end non-volatile physical storage 1110a, 1110b to be stored in the cache layer 1104b. In at least one embodiment, the inline processing may include performing compression and data duplication. Although in following paragraphs reference may be made to inline processing including compression and data deduplication, more generally, the inline processing may include performing any suitable or desirable data processing operations as part of the I/O or data path (e.g., where such operations may include any of compression and data deduplication, as well as any other suitable data processing operation).

In a manner similar to that as described for the data path 1104, the data path 1106 for the processor node B 1102b has its own FE component 1106a, cache layer 1106b, inline processing layer 1105b, and BE component 1106c that are respectively similar to the components 1104a, 1104b, 1105a and 1104c. The elements 1110a, 1110b denote physical storage provisioned for LUNs whereby an I/O may be directed to a location or logical address to read data from, or write data to, the logical address. The LUNs 1110a, 1110b are examples of storage objects representing logical storage entities included in an existing data storage system configuration. Since, in this example, writes directed to LUNs 1110a, 1110b may be received for processing by either of the nodes 1102a and 1102b, the example 1100 illustrates what may also be referred to as an active-active configuration.

In connection with a write operation as may be received from a host and processed by processor node A 1102a, the write data may be written to the cache 1104b, marked as write pending (WP) denoting it needs to be written to physical storage 1110a, 1110b and, at a later point in time, the write data may be destaged or flushed from the cache to the physical storage 1110a, 1110b by the BE component 1104c. The write request may be considered complete once the write data has been stored in the cache whereby an acknowledgement regarding the completion may be returned the host (e.g., by component 1104a). At various points in time, WP data stored in the cache is flushed or written out to the physical storage 1110a, 1110b. In connection with the inline processing layer 1105a, prior to storing the original data on the physical storage 1110a, 1110b, compression and data deduplication processing may be performed that converts the original data (as stored in the cache prior to inline processing) to a resulting form (that may include compressed and/or deduplicated portions) which is then written to the physical storage 1110a, 1110b. In at least one embodiment, when deduplication processing determines that a portion (such as a block or one or more sub-blocks) of the original data is a duplicate of an existing data already stored on the physical storage 1110a, 1110b, that particular portion of the original data is not stored in a compressed form and may rather be stored in its deduplicated form (e.g., there is no need for compression of a block or sub-blocks determined to be duplicates of other existing data). If an original data portion is not a duplicate of an existing portion already stored on the physical storage 1110a, 1110b, the original data portion may be compressed and stored in its compressed form on the physical storage 1110a, 1110b.

In connection with a read operation to read a block of data, a determination is made as to whether the requested read data block is stored in its original form (in the cache 1104b or on the physical storage 1110a, 1110b), or whether the requested read data block was previously deduplicated or compressed. If the requested read data block (which is stored in its original decompressed, non-deduplicated form) is in the cache, the read data block is retrieved from the cache 1104b and returned to the host. Otherwise, if the requested read data block is not in the cache 1104b but is stored on the physical storage 1110a, 1110b in its original form, the requested data block is read by the BE component 1104c from the backend storage 1110a, 1110b, stored in the cache and then returned to the host.

If any sub-block of the requested read data block was previously deduplicated, the original corresponding sub-blocks of the read data block are recreated and stored in the cache in its original form so that it can be returned to the host. If the requested read data block, or unique sub-block thereof, was previously compressed, the block (or compressed portion thereof) is first decompressed prior to sending the read data block to the host. If the compressed read data block or sub-blocks are already stored in the cache, the data may be uncompressed to a temporary or buffer location, the uncompressed data is sent to the host, and the buffer or temporary location is released. If the compressed read data block (or compressed sub-blocks thereof) is not in the cache but stored on the physical storage 1110a, 1110b, the compressed read data block (or compressed portions thereof) may be read from the physical storage 1110a, 1110b into the cache, uncompressed to a buffer or temporary location, and then returned to the host. Thus, requested read data stored on the physical storage 1110a, 1110b may be stored in a deduplicated or compressed form as noted above where processing is performed by the inline processing 1105a to restore or convert the deduplicated or compressed form of the data to its original data form prior to returning the requested read data to the host.

When the processor performs processing, such as in connection with inline processing 1105a, 1105b as noted above, data may be loaded into the cache. In particular, inline compression (ILC) and inline data deduplication (ILD) may be performed as part of the inline processing 1105a, 1105b. In at least one embodiment as noted above, the size of a data block processed by ILC and ILD may be 4K bytes where the block is partitioned into 8 equal sized portions (e.g., 512 bytes each) referred to as sub-blocks or sectors.

In at least one embodiment in accordance with the techniques herein, following paragraphs may provide examples of deduplication processing performed inline as part of the I/O or data path, as described above in connection with ILD processing of FIG. 11. However, it should be noted that the techniques herein are more generally applicable for use in deduplication performed which is not inline or not part of the I/O or data path, such when processing a data set offline or in the background.

Described above are techniques that may be used for performing data deduplication that provide for a smaller or finer level of granularity for determining matching or duplicate data portions at the sub-block or sector level, sometimes referred to herein as partial deduplication, partial block deduplication, or sub-block deduplication. A data block in embodiments described above include 8 sub-blocks identified as sub-blocks 0 through 7. Sub-block 0 for a particular data block may also be referred to as the left-most or "L" sub-block and sub-block 7 for a particular data block may also be referred to as the right most or "R" sub-block. Embodiments of techniques described above for partial or sub-block deduplication, such as in the FIG. 9, include calculating the sub-block or sector hashes for each candidate block and then searching the dedupe DB 150 to determine whether a sub-block of the candidate matches an existing L or R sub-block of a target current stored in the dedupe DB 150. Such processing may be performed for a candidate block which results in no matches being located in the dedupe DB 150.

What will now be described are additional techniques that may be used to further optimize data deduplication processing in an embodiment in accordance with the techniques herein. The following paragraphs provide for further optimizing deduplication processing, for example, in efforts to reduce computational resources when performing partial or sub-block deduplication processing for candidate blocks. In at least one embodiment in accordance with the techniques herein, a distance function may be used to evaluate whether a particular target block is expected to have any sub-block that will match a sub-block of a candidate block. The distance function may be used to provide a measurement or degree of similarity between two data blocks, such as the candidate block and a particular target block. Thus, in at least one embodiment in accordance with the techniques herein, a decision may be made using a distance value computed using a distance function as to whether to look for partial or sub-block matches for the candidate block within that particular target block. In at least one embodiment, a threshold may be defined for use with computed distances. If a distance computed with respect to two data blocks using the distance function is less than the threshold, the two data blocks may be similar and expected to have one or more matching sub-blocks. Otherwise, if the distance computed with respect to two data block using the distance function is not less than the threshold, the two data blocks may not be similar and are not expected to have one or more matching sub-blocks. In at least one embodiment, the distance function may be an entropy-based distance function. Further details regarding the distance function, entropy and how entropy may be calculated are described in more details in following paragraphs.

In the following paragraphs and examples, reference is made to data blocks that are each 4K bytes in size and wherein each of the data blocks includes 8 sub-blocks or sectors (e.g., each sub-block or sector being 512K bytes) for purposes of illustration. Generally, each data block may be any suitable size and may include any suitable number of sub-blocks, where each sub-block may be any suitable size.

Reference is made back to the dedupe DB 150 of FIG. 1. In at least one embodiment, the dedupe DB 150 may be stored in a portion of the memory 130 used as a cached copy of the dedupe DB 150. The dedupe DB 150 stored in the memory, such as a cache, may be only a subset or portion of the actual total number of entries of the on-disk dedupe DB as stored persistently on non-volatile physical storage. In at least one embodiment, deduplication processing may be performed using only the portion of the dedupe DB currently in the memory or the cache without retrieving other portions of the dedupe DB from the non-volatile storage. In other words, if a look up for a digest of a sub-block is performed and there is no matching entry in the cached portion of the dedupe DB 150, in such an embodiment there is no further lookup in the on-disk dedupe DB and processing determines that there is no entry in the dedupe DB for digest (e.g., sub-block is unique and not a duplicate).

In an embodiment in accordance with the techniques herein, the dedupe DB 150 may include entries for the L and R sub-blocks of each target block as described above in connection with FIG. 1. Additionally, the dedupe DB 150 may also include entries for the digest of each complete or full target data block (e.g., formed using all 8 sub-blocks of the target block). Thus, each entry of the dedupe DB 150 may include a digest, an associated digest key type of L (for digests of the L sub-block), R (for digests of the R sub-block) or F (for digests of the full target data block), and a reference (ref), to a location in the data storage system, of a data block. More generally, the reference field of an entry that is of one of the types L, R or F maps to a location in some form of memory or storage containing a data block whereby the reference field is used to access the actual content stored in the data block. The foregoing and other features are described below in more detail.

If an entry of the dedupe DB has a digest key type of L, the entry includes a digest of an L sub-block of a particular target data block stored at the location identified by the reference field of the entry. If an entry of the dedupe DB has a digest key type of R, the entry includes a digest of an R sub-block of a particular target data block stored at the location identified by the reference field of the entry. If an entry of the dedupe DB has a digest key type of F, the entry includes a digest of a full target data block and the content of the target data block having the digest may be obtained using the reference field of the entry.

In at least one embodiment in accordance with the techniques herein, deduplication processing may include first performing full block deduplication processing to determine whether there is a full or complete data block match between a target block and a candidate block for which deduplication processing is performed. Responsive to determining there is no full or complete match between a target block and a candidate block, partial or sub-block deduplication processing may be performed.

The digest entries of the dedupe DB 150 with an associated F digest key type may denote digests used in connection with performing the full block deduplication processing in at least one embodiment in accordance with the techniques herein. The hash function or algorithm used to generate the full data block or F type digests in an embodiment may generally be any suitable function having an acceptable expected hash collision probability or level of hash resistance. In at least one embodiment, the hash function used to compute full block digests of F type entries of the dedupe DB, and more generally, compute full block digests of data blocks for full block deduplication processing may be a cryptographic hash function such as SHA-1 or SHA-256.

When performing full block deduplication processing for a candidate block, at least one embodiment of the techniques herein may include computing the full block digest for the candidate block and comparing the computed full block digest for the candidate to the F type digest entries of the dedupe DB 150 to determine whether there is a match between the computed full block digest for the candidate and a digest of an F-type entry of a target block of the dedupe cache 150. If a match is found, processing may then be performed to compare (e.g., byte-by-byte) the content of the candidate block with the content of the target block having the matching F-type entry of the dedupe cache 150 and ensure the actual data contents of the candidate and target blocks match. If the actual contents of the candidate and target blocks match, processing then proceeds to store the candidate block as a full deduplicated block (e.g., duplicate of the target block). If no complete full block match is found between a target block and the candidate block, partial or sub-block deduplication may be performed.

Consistent with discussion elsewhere herein, for a candidate block that is found to be unique (e.g., whereby there is no matching target block and no matching partial or sub-block deduplication performed), the candidate block may be stored as a new target block and processing may include persistently storing the content of the new target block and additionally storing digests for the new target block in the dedupe DB 150. In at least one embodiment, such processing for the new target block may include creating corresponding L, R and F entries for the new target block in the dedupe DB 150.

As noted above, an embodiment in accordance with the techniques herein may use a distance function to provide a measurement or degree of similarity between two data blocks, such as a candidate block and a particular target block. In at least one embodiment, the entropy function or operation may be used in connection with defining a distance function $D(x,y)$ that provides a measurement of similarities with respect to the data content of two data blocks, x and y. More formally, in at least one embodiment, $D(x,y)$ may be a numerical value that is a distance measurement with respect to a pair of data blocks, x, and y, where the following properties hold:

1. $D(x,y) > 0$.
2. $D(x,y) = 0$ if, and only if $x=y$.
3. $D(x,y) = D(y,x)$.

Furthermore for an additional data block z,

4. $D(x,y) \leq D(x,z) + D(z,y)$

In connection with the techniques herein where D is determined with respect to data blocks x and y, z may be any arbitrary data block in the same data space as the data blocks x and y.

Rather than use the actual data content of the data blocks in connection with computing the distance D for two data blocks, x and y, an embodiment in accordance with the techniques herein may use a distance function D described in more detail below in which the distance denoting similarities between data blocks x and y is determined using full block entropy values for x and y. When using entropy values of x and y, rather than the actual data blocks x and y, to compute an entropy-based distance as described in more detail below, it should be noted that the second condition or property #2 above is not satisfied since two different data blocks may have the same entropy. However in an embodiment in accordance with the techniques herein, satisfaction of the second condition or property #2 above is not required when using the entropy-based distance as described in connection with the techniques herein. The entropy-based distance function described below provides a metric denoting a level or degree of similarity expected between sub-blocks of the two data blocks and may be used in an embodiment in accordance with the techniques herein to assess whether a candidate block B1 and a target block T1 are similar, and therefore, expected to have at least one matching sub-block between them. In at least one embodiment, the entropy-based distance function described below may be used in assessing whether to perform partial deduplication with respect to the candidate block B1 and a particular target block T1. Such a computed entropy-based distance with respect to blocks x and y, where x=the candidate block B1 and y=the target block T1, may be used to draw an inference about the similarities within the two blocks (e.g., regarding the data content of the 2 blocks) without comparing the contents of the two blocks. The foregoing and other aspects of the techniques herein are described below in more detail.

In at least one embodiment, an entropy function may be used to compute the entropy for each target data block. In such an embodiment, the computed entropy E may be determined using all the content for the target data block (e.g., all 8 sub-blocks). In at least one embodiment, the computed entropy for each target block may be stored in the dedupe DB 150 as an additional type of entry referred to as an E type entry. An E type entry may include the computed entropy value using all the content for the target data block. The E type entry may be included in the dedupe DB 150 including fields as described herein, for example, for F type digest entries with the difference that an E type entry includes a type designating this entry as an E (entropy) type entry, and the computed entropy value for the target data block. With an E type entry, the reference field identifies the location (e.g., in the cache or in persistent storage) of the content of the target data block having the entropy value stored in the E type entry. More generally, the E type entry for a target data block may include the calculated entropy value for the target data block and the reference identifying the location (e.g., in the cache or in persistent storage) of the content of the target data block, where all such E type entries for target data blocks may be stored in the dedupe DB 150 or another separate DB or structure. For example, in at least one embodiment with reference to FIG. 1, the E type entries for target data blocks may be stored in a separate entropy DB that is stored in the data cache 136, or more generally, in the memory 130. Additionally, the entropy DB may be stored persistently on non-volatile storage, such as the storage 190. At any point in time, some or all of the entropy DB may be stored in the cache 136 or memory 130.

In at least one embodiment, the distance function D may be an entropy-based distance function defined using the entropies computed using an entropy function E as follows:

$$D(x,y) = \text{ABS\_VALUE}(E(x) - E(y)) \qquad \text{EQUATION 1}$$

Where

E is the entropy function that computes the entropy value for an input within parenthesis;

$E(x)$ is the entropy value computed using the function E for the data block x;

$E(y)$ is the entropy value computed using the function E for the data block y; and ABS_VALUE denotes the absolute value of the input within parenthesis.

In this above EQUATION 1, the input to ABS_VALUE is the mathematical difference between $E(x)$ and $E(y)$.

As a variation to the entropy-based distance computed using EQUATION 1, an embodiment may alternatively use normalized entropy values. For example, as described in more detail elsewhere herein, entropy values may be a real number in the inclusive range 0.0 through 8.0. In such an embodiment, the computed distances of EQUATION 1 may be further normalized by dividing the computed entropy by 8.

In at least one embodiment in accordance with the techniques herein, a decision may be made using the distance function D of EQUATION 1 as to whether to look for partial or sub-block matches for the candidate block B1 within that particular target block T1, where x=the candidate block B1 and y=the target block T1. In this manner, the distance function D of EQUATION 1 denotes a measurement of similarity between the blocks B1 and T1. For example, lower distance values may denote a higher degree of similarity or lower degree of differences between B1 and T. If the distance D as computed using EQUATION 1 is less than a specified threshold distance denoting a threshold level of similarity, then it may be determined that B1 and T1 have at least the specified threshold level of similarity. Comparatively, smaller computed distance values that are less than the threshold level denote a smaller distance or smaller assessed difference between B1 and T1 and may be characterized as having a higher degree or level of similarity than that denoted by the threshold (e.g., such smaller computed distance values exceed the minimum required similarity denoted by the threshold). Larger computed distance values that are more than the threshold level denote a larger distance or larger assessed difference between B1 and T1 and may be characterized as having a lower degree or level of similarity than that denoted by the threshold (e.g., such larger computed distance values do not meet the minimum required similarity denoted by the threshold). In at least one embodiment, if D (e.g., as computed using EQUATION 1), is less than the threshold, then blocks B1 and T1 are similar; and otherwise B1 and T1 are determined as not similar.

What will now be described is entropy and how entropy may be calculated in at least one embodiment in accordance with the techniques herein for use in connection with the distance function D of EQUATION 1.

Information entropy may be characterized as the average rate at which information is produced by a stochastic source of data. The definition of entropy used in information theory is analogous to the definition used in statistical thermodynamics. The concept of information entropy was introduced by Claude Shannon in "A Mathematical Theory of Communication", The Bell System Technical Journal (Volume: 27, Issue: 3, July 1948; pages 379-423). The measure of information entropy associated with each possible data value may be expressed as the negative logarithm of the probability function for the value. When the data source has a lower-probability value (i.e., when a low-probability event occurs), the event carries more "information" ("surprisal") than when the source data has a higher-probability value. The amount of information conveyed by each event defined in this way becomes a random variable whose expected value is the information entropy. Generally, entropy refers to disorder or non-uniformity. As a metric, an entropy value denotes a measure of the randomness of data, or a random distribution of symbols. As discussed elsewhere herein, the higher the entropy value for a data block, the more irregular or random the distribution of bits within the data block. In contrast, the lower the entropy value for the data block, the more uniform the distribution of the bits within the data block.

The relationship between entropy and compressibility is discussed, for example, in "Relationship Between Entropy and Test Data Compression", Kedarnath J. Balakrishnan and Nur A. Touba, IEEE Transactions on Computer-Aided Design of Integrated Circuits and Systems, Vol. 26, No. 2, February 2007, pages 386-395, and "Entropy and Compressibility of Symbol Sequences", Werner Ebeling, PhysComp96 (Physics and Computation 1996), Feb. 23, 1997, both of which are incorporated by reference herein. As explained in "Relationship between Entropy and Test Data Compression", entropy of a data set is a measure of the amount of information in the data set. Entropy calculations for fully specified data have been used to get a theoretical bound on how much the data can be compressed. In "Relationship between Entropy and Test Data Compression", the concept of entropy is extended for incompletely specified test data that has unspecified or don't care bits. "Entropy and Compressibility of Symbol Sequences" investigates long-range correlations in symbol sequences using methods of statistical physic and non-linear dynamics.

Entropy, H, with respect to a data set may be expressed as:

$$H = -\Sigma_{i=0}^{N-1} P_i \log_2(P_i) \qquad \text{EQUATION 2}$$

Where $P_i$ is the probability of occurrence of symbol $X_i$ in the data set;

N is the total number of unique symbols; and $\log_2$ is the base 2 logarithm.

Generally, entropy for the data set depends on the symbol length L. Assume the data set is partitioned into sections where each section includes L bits of data. Thus L denotes number of bits in each section and L also denotes the length of the symbol. For a given symbol length, entropy for the data may be calculated to provide a value that denotes an expected or predicted level of compressibility for the data. Note that $P_i$, the probability of symbol $X_i$ refers to the actual frequency of the symbol $X_i$ in the data set. Thus, $P_i$ for $X_i$ may be calculated as the frequency or number of times $X_i$ appears in the data set divided by the total number of sections in the data set.

Although particular values are selected for purposes of illustration, more generally, the entropy value used with techniques herein may be determined for any size data block or data set that may include symbols of any suitable number of bits (e.g., any symbol length) having any number of unique symbols.

In at least one embodiment in accordance with techniques herein, L may be 8 where each symbol may include 8 bits (e.g., have a symbol length of 8). In such an embodiment, each symbol or bit pattern of 8 bits denotes a byte of information having a numerical data value (base 10) in the range from 0 to 255, inclusively. In such an embodiment, N, the number of unique symbols (e.g., numerical value of bit patterns) is 256, and EQUATION 2 for calculating entropy, H, may be expressed as:

$$H = -\sum_{i=0}^{255} P_i \log_2(P_i) \qquad \text{EQUATION 3}$$

The entropy values calculated using EQUATION 2 and EQUATION 3 are (e.g., real numbers) within the inclusive range of 0 to 8. For a given data set, the larger the entropy value (e.g., closer to 8), the more random the data; and the smaller or lower the entropy value (e.g., close to 0), the more uniform the data.

In at least one embodiment, an entropy value may be determined for each 4 KB (kilobyte) block or chunk of a data set. Thus, each 4 KB data block includes 4096 bytes (e.g., 4*1024). Generally, the data set may be any defined set of stored data such as, for example, a database, one or more selected portions or logical address space portions of a database, data used by a particular application stored on one or more LUNs, selected portions of one or more LUNs, one or more files, one or more directories, one or more file systems, particular portions of one or more directories or file systems, and the like.

Referring to FIG. 12A, shown is an example 1300 illustrating a data block and associated information that may be used in an embodiment in accordance with the techniques herein. The example 1300 includes data block 1310 having a size of 4 KB=4096 bytes. The data block 1310 may be partitioned into bytes or 8 bit segments where each byte denotes a symbol having a numeric value from 0 to 255, inclusively. For example, element 1310a denotes a byte or symbol having a value of 0 and element 1310b denotes a byte or symbol having a value of 1. To calculate the entropy for data block 1310, information in table 1320 may be determined. Table 1320 includes the following columns: symbol $X_i$ 1320a, numeric value of symbol $X_i$ 1320b, frequency of $X_i$ 1320c and probability $P_i$. Each row of 1320 includes a set of information for each unique symbol that can occur in the data block. Thus, the table 1320 may include 256 rows, one row for each of the unique symbols having corresponding numeric values from 0 to 255, inclusively.

The row 1322 denotes that the numeric value 0 for symbol "0000 0000" has a frequency of 2048 and a probability $P_i$=0.50. The row 1324 denotes that the numeric value 1 for symbol "0000 0001" has a frequency of 1024 and a probability $P_i$=0.25. The row 1326 denotes that the numeric value 2 for symbol "0000 0010" has a frequency of 512 and a probability $P_i$=0.125. The row 1328 denotes that the numeric value 3 for symbol "0000 0011" has a frequency of 512 and a probability $P_i$=0.125. The element 1330 indicates that the remaining symbols each have a frequency=0 and thus a probability $P_i$=0. Based on EQUATION 3 and using the information from table 1320 for the data block 310, the calculated entropy value for data block 1310 is 1.75.

As noted above, the entropy function E may calculate an entropy value for a specified input data block. In at least one embodiment, the entropy function E may calculate an entropy value for an input data block based on EQUATION 3 and as illustrated with an example data block in connection with FIG. 12A. As also described above, an entropy-based distance with respect to a target block T1 and candidate block B1 may be calculated using the distance function D of EQUATION 1. In at least one embodiment, the entropy function E may calculate (e.g., as in EQUATION 3) an entropy value E(B1) for the candidate block B1 and an entropy value E(T1) for the target block T1, where E(B1) and E(T1) may be used with EQUATION 1 to further compute the distance D(B1, T1), the distance between B1 and T1. The distance D(B1, T1) may be compared to a threshold distance. If D(B1, T1) is less than the threshold distance, then B1 and T1 are determined to be similar and partial or sub-block deduplication processing may be performed with respect to B1 and T1 where such processing determines what one or more sub-blocks of B1 may be deduplicated using one or more sub-blocks of T1. Otherwise, if D(B1, T1) is not less than the threshold distance, then B1 and T1 are determined as not similar and partial or sub-block deduplication may proceed by not further examining T1 for duplicate sub-blocks of B1 and may now proceed to evaluate a second target block T2. The evaluation of T2 may be performed in a manner similar to that as described herein with respect to T1. In particular, the distance D(B1, T2) may be compared to a threshold distance. If D(B1, T2) is less than the threshold distance, then B1 and T2 are determined to be similar and partial or sub-block deduplication processing may be performed with respect to B1 and T2 where such processing determines what one or more sub-blocks of B1 may be deduplicated using one or more sub-blocks of T2. Otherwise, if D(B1, T2) is not less than the threshold distance, then B1 and T1 are determined as not similar and partial or sub-block deduplication may proceed by not further examining T2 for duplicate sub-blocks of B1 and may now proceed to evaluate one or more other target blocks as possibly used to partially deduplicate B1.

To further illustrate, consider T1 and B1 as noted above where T1 is an existing target block and B1 is a candidate block for which deduplication processing is being performed. In at least one embodiment, full block deduplication processing for B1 has been performed and failed to find a matching target block (e.g., B1 is not fully dedupable). As such, processing may now be performed using the techniques herein in connection with partial or sub-block deduplication processing. The distance function as in EQUATION 1 may be used to determine whether to perform partial deduplication processing of B1 with respect to T1. Using the distance function of EQUATION 1, processing may compute a distance with respect to the entropy values of B1 and T1, denoting a measurement of similarity between B1 and T1. If the distance as computed using EQUATION 1 is less than a specified threshold, B1 and T1 are similar and the contents of B1 is expected to be similar to the contents of T1. In contrast, if the distance as computed using EQUATION 1 is not less than the specified threshold, B1 and T1 are not similar and the contents of B1 is not expected to be similar to the contents of T1. Thus, the distance computed using EQUATION 1 is a metric that provides a measurement denoting the degree of similarity between B1 and T1.

Assume, for example, that B1 has a first entropy value E1=6.0 computed using the entropy function E, and T1 has a second entropy value E2=4.0 computed using the entropy function E. Based on EQUATION 1, the computed distance D=2.0. Assume the specified threshold is, for example, 3.0. Thus, the computed distance D=2.0 is less than the specified threshold of 3.0, whereby B1 and T1 are determined as similar and have at least the specified degree of similarity indicated by the threshold.

Responsive to determining the computed distance D is less than the threshold of 3.0, processing may determine that B1 and T1 are similar whereby partial deduplication processing may examine sub-blocks of T1 to determine whether one or more sub-blocks of B1 match one or more sub-blocks of T1. In at least one embodiment, partial or sub-block deduplication may be performed with respect to B1 and T1 in a manner similar to that as described above such as in connection with FIG. 9. For example, processing may compute sub-block digests for the sub-blocks of the candidate B1 (e.g., step 930) and compare (e.g., step 940) such computed sub-block digests for the candidate B1 to the L and R digests for the L and R sub-blocks of T1 as stored in the dedupe DB 150. If a match is found between a sub-block digest for candidate B1 and an L or R digest for T1, (step 950 evaluates to yes), processing of step 960 and 970 of FIG. 9 may be performed. If no match is found between a sub-block digest for candidate B1 and an L or R digest for T1, partial deduplication processing may proceed to examine another existing target block T2 and assess whether to perform partial deduplication processing of B1 with respect to T2. Thus, T2 may be processed and assessed in a manner similar that as described herein for the target block T1.

As a variation to that as described above, responsive to determining the distance between B1 and T1 as computed using EQUATION 1 is less than the threshold, an embodiment may perform partial or sub-block deduplication of B1 with respect to T1 by simply performing a byte-by-byte comparison of B1 and T1 to determine which bytes of B1 and T1 match. In this latter variation, an embodiment may omit calculating the sub-block level digests for the sub-blocks of B1 and may omit comparing such sub-block digests for B1 to sub-block L and R digests for T1 as stored in the dedupe DB 150. Processing may be performed, for example, as described in connection with steps 960 and 970 of FIG. 9 to identify one or more duplicate sub-block ranges of B1 that match sub-blocks of T1. Additionally, such processing may identify one or more unique regions or ranges of B1 that cannot be deduplicated, such as using sub-blocks of T1.

In at least one embodiment, full block deduplication processing may be performed prior to calculation of the distance based on EQUATION 1 and prior to perform partial or sub-block level deduplication processing. For example, full block deduplication processing may be performed by calculating a first full block digest for B1, and then comparing the first full block digest for B1 to other full block digests of F type entries for target blocks stored in the dedupe DB 150. Such full block deduplication processing may be unsuccessful in full block deduplication of B1 (e.g., failed to locate a digest of an F type entry for a target block in the dedupe DB 150 matching the first full block digest for B1). If the candidate block B1 does not match an existing target block, partial or sub-block deduplication may be performed, such as using the computed distance D of EQUATION 1 with respect to the candidate block B1 and one or more target blocks. If the computed distance D of EQUATION 1 with respect to a particular target block T1 is less than a specified threshold, then further processing may be performed to locate sub-blocks of B1 matching sub-blocks of T1 whereby B1 may be partially deduplicated using one or more sub-blocks of T1.

In at least one embodiment, the distance function such as expressed in EQUATION 1 may be computed using the entropy values for the candidate block B1 and the target block T1, as noted above. Furthermore, in such an embodiment, the distance D(B1, T1) computed may be used to determine whether B1 and T1 are similar and therefore expected to have one or more of matching sub-blocks.

Referring to FIG. 12B, shown is a table of entries including entropy values of target blocks that may be used in an embodiment in accordance with the techniques herein. As noted elsewhere herein with reference to FIG. 1, the entropy values for the target blocks may be stored in the memory 130 (e.g., in the data cache 136 or in the dedupe DB 150) of the SP 120. The example 1200 shows one arrangement of the E type entries as described herein in a table, database, and the like, stored in the memory 130 and also on persistent storage 190. In at least one embodiment, the example 1200 may include E type entries for target data blocks. The table 1200 includes two columns—a first column 1202 of entropy values for target data blocks, and a second column 1204 of references (refs) identifying locations of target data blocks. Each row or entry of the table 1200 is a single E type entry for a different target data block. For example, row 1210 includes an entropy value of 1.5 in column 1202 for a target data block identified in the reference column 1204 of the row 1210 by the location Ref1. For example, Ref1 may be an address or pointer used to identify the location of the contents of the target data block associated with the row 1210.

In at least one embodiment, the entries of the table 1200 may be stored in a sorted order based on the entropy values of the entries in the table 1200. For example, as illustrated, the entries of the table 1200 may be sorted in increasing entropy value order whereby column 1202 may be used as a key field to access a particular entry of the table 1200.

In at least one embodiment, when performing partial deduplication processing for a candidate data block, a target data block may be selected from all target blocks stored in the table 1200 where the selected target block has an associated entropy value matching, or closest to, the computed entropy value for the candidate data block. Generally, target data blocks may be selected for partial deduplication processing with respect to a candidate block in an order based on distance. The target data block selected may have the minimum distance (e.g., as determined using EQUATION 1) of all existing target blocks with respect to the candidate data block. For example, if the candidate data block as an entropy value of 1.7, an embodiment may determine a sequential order in which target data blocks are processed for partial deduplication as follows: row 1212, row 1211 and row 1210. Assume, for example, that an embodiment allows partial deduplication with respect to 2 target data blocks. Partial or sub-block deduplication may determine that a first target block, having the entropy 1.7 as identified by row 1212, has at least one sub-block that matches a sub-block of the candidate target block. Processing may then continue by examining a second target block having the entropy 1.6 as identified by row 1211 and determine that the second target block and the candidate target block do not have any matching sub-block. Processing may then continue by examining a third target block having the entropy 1.5 as identified by row 1210 and determine that the third target block and the candidate target block have at least one matching sub-block. Thus, at least a first sub-block of the candidate block is partially deduplicated as a duplicate of the first target block, and at least a second sub-block of the candidate block is partially deduplicated as a duplicate of the third target block. Of course, the number of target blocks actually examined for a particular candidate block may vary with embodiment and may vary with the maximum number of target blocks against which partial deduplication may be performed for a single candidate data block.

What will now be described is use of entropy values in connection with compression as well as deduplication processing in at least one embodiment in accordance with the techniques herein.

Compression processing such as performed by ILC threads is generally a CPU intensive operation. However, there is a relationship between entropy and data compression where a computed entropy value for a data block may denote a measure or degree of compressibility of the data block. Generally, computation of an entropy value for a data block may be characterized as lightweight in terms of CPU requirements as opposed to performing compression processing for the data block. In at least one embodiment in accordance with techniques herein, the computed entropy value for a candidate data block may be used in connection with partial deduplication processing as noted above. Additionally, such an embodiment may also use the computed entropy value for a candidate block in connection with determining whether or not to proceed with compressing the candidate data block. Computing the entropy value for a data block is generally more CPU efficient than actually compressing each data block in order to determine whether or not it (the data block) is compressible (and should therefore be stored in its compressed form), or otherwise achieves at least a minimum amount of data reduction (e.g., whether or not a compressed form of a data block has a reduced size that is less than the size of the original data block by at least a threshold amount) to warrant storing the data block in its compressed form.

In at least one embodiment, an entropy threshold may be specified where compression, such as part of ILC, may be performed for data blocks having an entropy value less than the threshold. Otherwise, the data block may not be compressed, such as in connection with ILC processing. Thus, the threshold denotes a maximum allowable entropy level in order for ILC to compress the data block. Generally, any suitable value for the threshold may be selected. In at least one embodiment in accordance with the techniques herein, the specified entropy threshold may be selected in accordance with the amount of overhead storage expected to be utilized when storing a partially deduplicated data block. The entropy for a candidate data block may be used as an indicator regarding the compressibility of the storage space savings estimated or expected for the candidate data block. If the storage space savings is expected to be greater when compressing the candidate data block as compared to partially deduplicating the candidate data block, processing may choose to compress the data block rather than perform partial deduplication processing for the data block.

The entropy values calculated using EQUATION 2 and EQUATION 3 are real numbers within the inclusive range of 0 to 8, where 0 denotes the maximum expected level of compressibility of the data for which the entropy is computed, and 8 denotes the minimum expected level of compressibility of the data for which the entropy is computed. For a given data set or data block, the larger the entropy value (e.g., closer to 8), the more random the data and the less compressible the data; and the smaller or lower the entropy value (e.g., close to 0), the more uniform the data and the more compressible the data.

With reference back to FIG. 12A where the computed entropy value for the data block is 1.75, based on the range of possible entropy values from 0 to 8, inclusively, an embodiment may use the entropy value of 1.75 to determine whether or not to compress the data block 1310. For example, consistent with discussion herein where the data block 1310 is a candidate data block being processed, an embodiment may perform the entropy calculation for the candidate data block 1310 inline as part of ILC and ILD processing of the I/O or data path, when writing or storing the data block 1310 to physical storage, such as illustrated and described in connection with FIG. 11. Based on the calculated entropy value for the candidate data block such as may be performed as part of ILC processing, an embodiment may determine whether to perform compression of the candidate data block inline as part of the I/O or data path.

In at least one embodiment in which the entropy values are not normalized such as in EQUATION 3, the entropy threshold may be a value in the inclusive range from 0.0 to 1.0. In at least one embodiment in which the entropy values as computed using EQUATION 3 are further normalized, the entropy threshold may be a value in the inclusive range from 0 to ⅛, or 0 to 12.5%. In at least one embodiment, processing may be performed to determine whether the candidate block is a duplicate of a single target block, whereby the candidate block is fully dedupable. If processing determines that the candidate block is not fully dedupable, the entropy value for the candidate block may be computed, such as using EQUATION 3. If the entropy value for the candidate data block is less than the entropy threshold, processing may be performed to store the candidate block in its compressed form. Otherwise, if the entropy for the candidate block is not less than the entropy threshold, partial or sub-block deduplication for the candidate block may be performed. In at least one embodiment, such partial or sub-block deduplication may include calculating the entropy-based distance for the candidate block and a target block to assess whether two blocks are similar. If the candidate and target blocks are similar (e.g., the distance as computed using EQUATION 1 is less than a specified distance threshold), then the sub-blocks of the candidate and target blocks may be compared to determine whether at least one sub-block of the candidate is a duplicate of the target block. If the candidate and target blocks are not similar (e.g., the distance as computed using EQUATION 1 is not less than a specified distance threshold), then partial deduplication processing may not further examine the sub-blocks of target block and may continue partial deduplication processing with a next target block.

Figure 13:
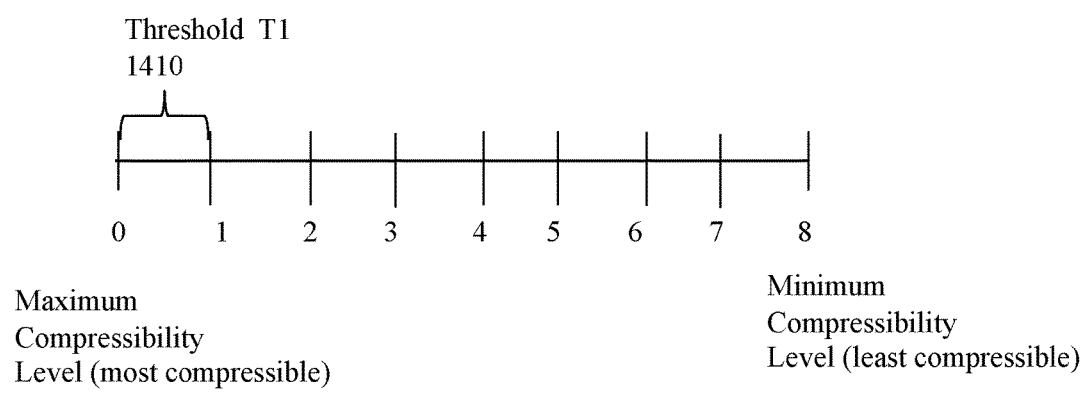
FIG. 13 is an example illustrating selection of an entropy threshold used in an embodiment in accordance with techniques herein.

Reference is made to FIG. 13 illustrating a threshold range within which a threshold for may be selected for use in an embodiment in accordance with techniques herein. The example 1400 illustrates the possible range of entropy values from 0 to 8, inclusively where element 1410 denotes that the entropy threshold T1 may be a value (e.g., real number) selected within the range of 0.0 to 1.0, inclusively. For example, assume T1 is selected as 1.0 whereby data blocks have associated entropy values within the range 0 to 1.0, inclusively, are compressed. With reference to the example described above in connection with FIG. 12A for the candidate data block 1310 having an entropy value of 1.75, it may be determined not to compress the candidate data block 1310 inline. In this case, partial or sub-block deduplication processing may alternatively be performed for the candidate block 1310.

As noted above, compression processing such as performed by ILC threads is generally a CPU intensive operation. As also described above, since a computed entropy value for a data block may denote a measure or degree of compressibility of the data block, such an entropy value may be used in determining whether or not to compress the data block and store the data block in its compressed form. Additionally, an embodiment in accordance with the techniques herein may use computed entropy values for a candidate data block and a target block to determine whether the two blocks are similar where at least one sub-block of the candidate data block is expected to match at least one sub-block of the target data block.

What will now be described are flowcharts of processing steps that may be performed in an embodiment in accordance with the techniques herein where such flowcharts summarize processing described above.

Figure 14:
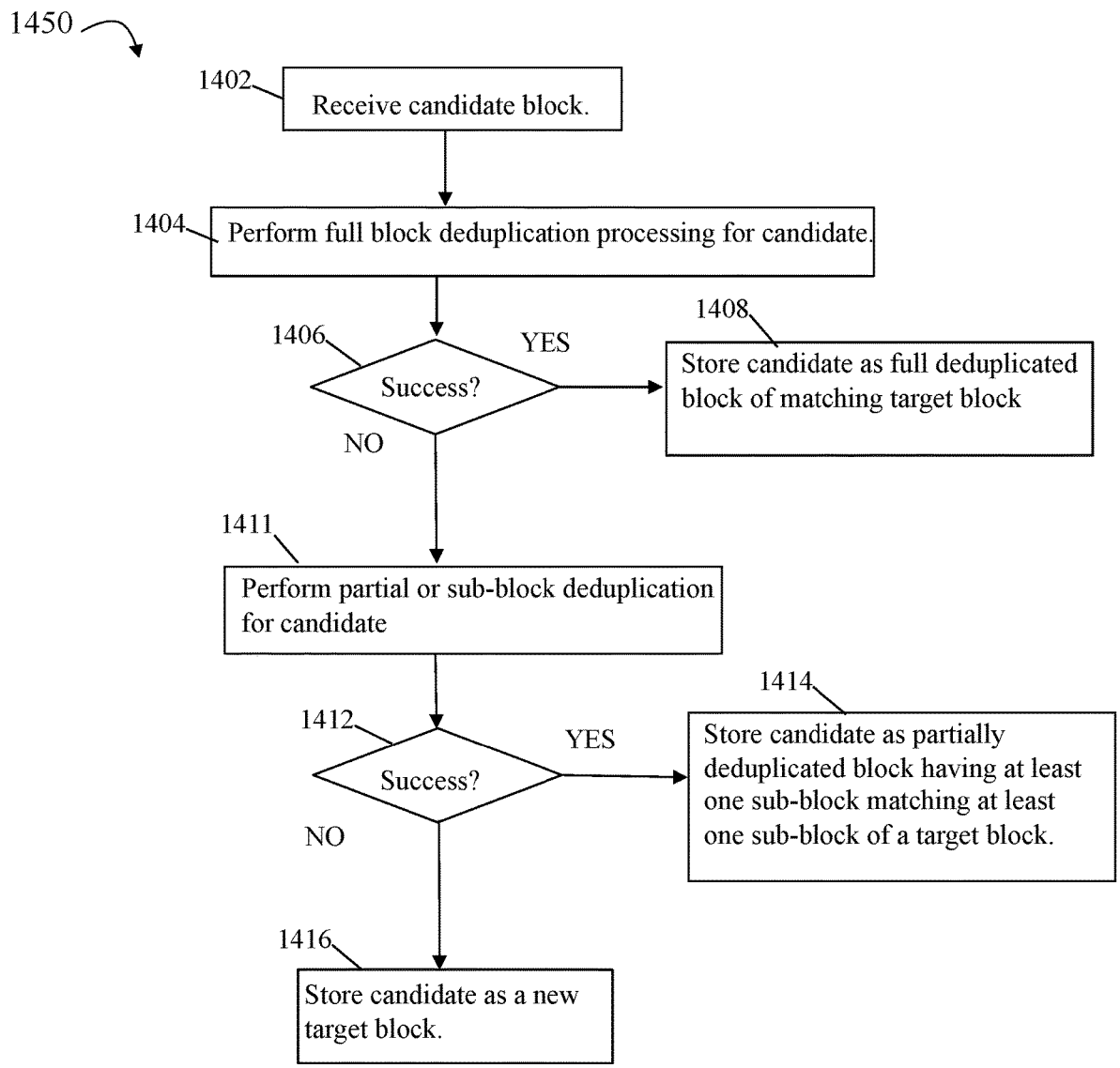
FIGS. 14, 15, 16A and 16B are flowcharts of processing steps that may be performed in an embodiment in accordance with the techniques herein.

Referring to FIG. 14, shown is a first flowchart 1450 of processing steps that may be performed in an embodiment in accordance with the techniques herein. The flowchart 1450 indicates processing steps that may be performed for a single candidate block whereby the steps of the flowchart 1450 may be repeated for subsequent candidate blocks.

At the step 1402, a candidate block is received. From the step 1402, control proceeds to the step 1404. At the step 1404, full block deduplication processing is performed for the candidate where the candidate is determined as a full block match of an existing target block. From the step 1404, processing proceeds to the step 1406. At the step 1406, a determination is made as to whether full block deduplication processing of step 1404 successfully located an existing target block that matches the candidate block. If the step 1406 evaluates to yes, control proceeds to the step 1408 where the candidate block is stored as a full deduplicated block of the matching target block.

If the step 1406 evaluates to no, control proceeds to the step 1411. At the step 1411, partial or sub-block deduplication processing is performed for the candidate block. From the step 1410, control proceeds to the step 1412. At the step 1412, a determination is made as to whether partial or sub-block deduplication processing of step 1411 successfully located an existing target block that having at least one sub-block matching at least one sub-block of the candidate block. If the step 1412 evaluates to yes, control proceeds to the step 1414 to store the candidate block as a partially deduplicated block having at least one sub-block that matches a sub-block of an existing target block. It should be noted that an embodiment may allow a single candidate block to be partially deduplicated with respect to one or more existing target blocks. If the step 1412 evaluates to no, control proceeds to the step 1416 to store the candidate as a new target block. The step 1416 may include persistently storing content of the candidate block on physical storage and also in cache. The step 1416 may include calculating one or more digest values for the new target block and storing such digest values as new entries in the dedupe DB 150. The one or more digest values may include an F type digest entry, and an E type entry for the new target block. Depending on the embodiment and the particular partial deduplication processing performed, the step 1416 may include storing an R type digest entry and an L type digest entry for the new target block.

Figure 15:
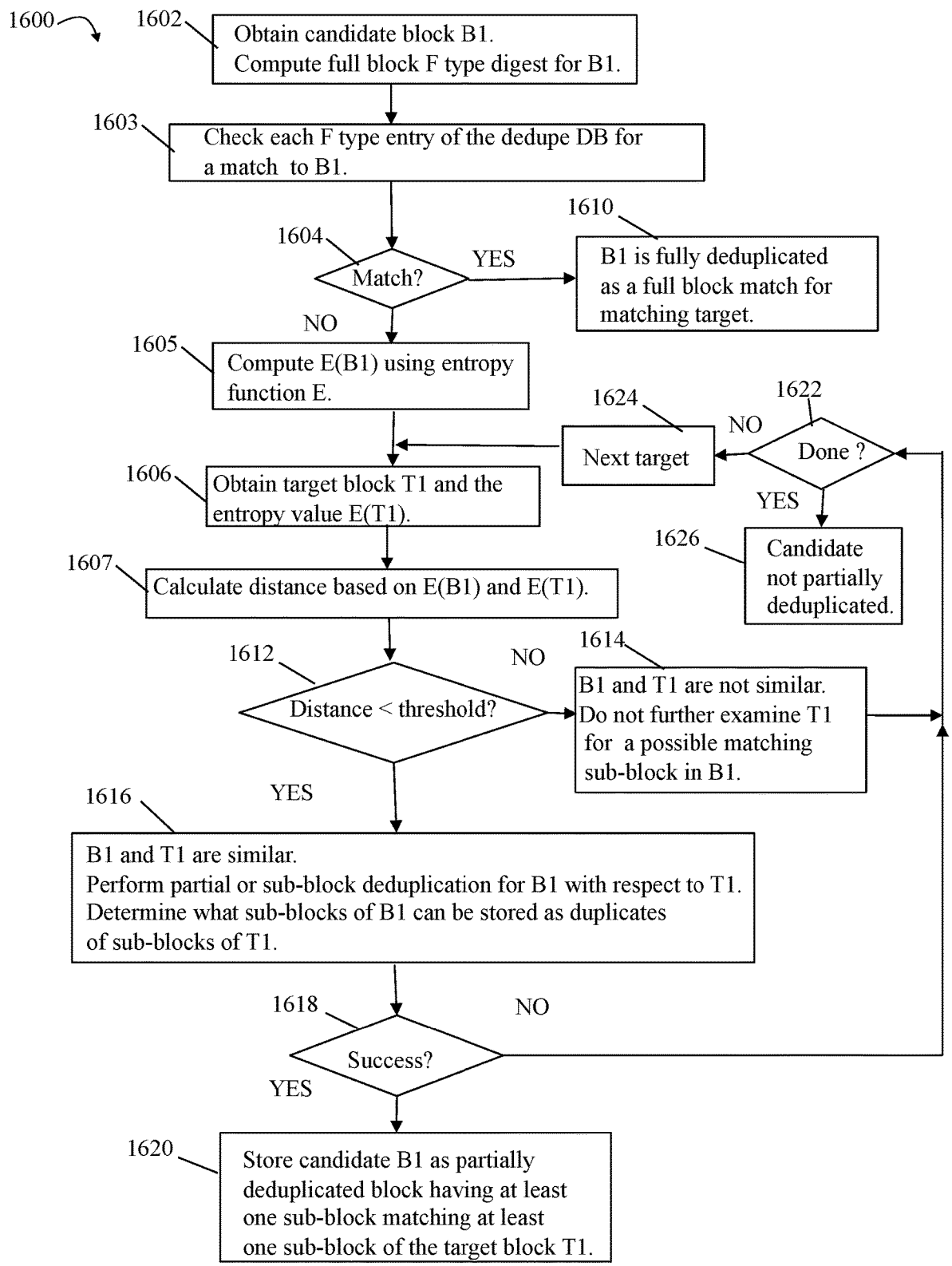

Referring to FIG. 15, shown is another flowchart 1600 of processing steps that may be performed in an embodiment in accordance with the techniques herein. The flowchart 1600 provides additional detail regarding one particular embodiment in which the distance function is computed, such as in EQUATION 1, based on the entropy values for the data blocks B1 and T1. The flowchart 1600 indicates processing steps that may be performed for a single candidate block whereby the steps of the flowchart 1600 may be repeated for subsequent candidate blocks.

At the step 1602, the candidate block B1 is obtained. The step 1602 includes computing an F type digest for the candidate block B1. As described herein the F type digest for B1 may be computed using a hash function and the full block content of B1. From the step 1602, control proceeds to the step 1603 where processing is performed to check each F type entry of the dedupe DB 150 for a match to B1. Step 1603 may include determining if there is an existing F type entry in the dedupe DB having a digest that matches the computed full block F type digest for B1 (as computed in the step 1602), and if so, comparing the actual content of the target data block having the matching entry to the content of B1. From the step 1603, control proceeds to the step 1604. At the step 1604, a determination is made as to whether a matching target block in the dedupe DB was found for the candidate block B1. If the step 1604 evaluates to yes, control proceeds to the step 1610. At the step 1610, B1 is processed as a full deduplicated block of the matching target block. The step 1610 is similar to the step 1408 of the FIG. 14. If the step 1604 evaluates to no, control proceeds to the step 1605 where processing is performed to compute E(B1) using the entropy function E. From the step 1605, control proceeds to the step 1606. At the step 1606, a target block T1 and the entropy value E(T1) for the target block are obtained. From the step 1606, control proceeds to the step 1607.

At the step 1607, processing is performed to calculate the distance between E(B1) and E(T1), such as using EQUATION 1. From the step 1607, control proceeds to the step 1612 where a determination is made as to whether the distance is less than a specified threshold. Consistent with discussion herein, the distance denotes a measurement of similarity between the candidate data block B1 and the target data block T1. If the step 1612 evaluates to no, control proceeds to the step 1614 where it is determined that B1 and T1 are not similar. In connection with the step 1614, processing does not further examine T1 for a possible matching sub-block in B1. From the step 1614, control proceeds to the step 1622 where a determination is made as to whether processing of all existing targets has completed.

If step 1622 evaluates to yes, control proceeds to the step 1626 where the candidate is not partially deduplicated and where the candidate block is stored as a new target block as denoted in the step 1416 of the FIG. 14. If the step 1622 evaluates to no, control proceeds to the step 1624 to obtain the next target block. From the step 1624, control proceeds to the step 1606 to continue partial or sub-block deduplication processing using the next target block as the current target block T1.

If the step 1612 evaluates to yes, control proceeds to the step 1616 where it is determined that B1 and T1 are similar. The step 1616 may include performing partial or sub-block deduplication for B1 with respect to T1. The step 1616 may include determining what sub-blocks of B1 can be stored as duplicates of the existing target block T1. From the step 1616, control proceeds to the step 1618 where a determination is made as to whether partial deduplication of B1 with respect to T1 was successful. Put another way, at the step 1618, a determination is made as to whether at least one sub-block of B1 can be deduplicated whereby the at least one sub-block of B1 can be stored as a matching sub-block of T1. If the step 1618 evaluates to yes, control proceeds to the step 1620. At the step 1620, processing is performed to store the candidate block B1 as a partially deduplicated block having at least one sub-block matching at least one sub-block of the target block T1. The step 1620 is similar to the step 1414 of FIG. 14. If the step 1618 evaluates to no, control proceeds to the step 1622.

Figure 16A:
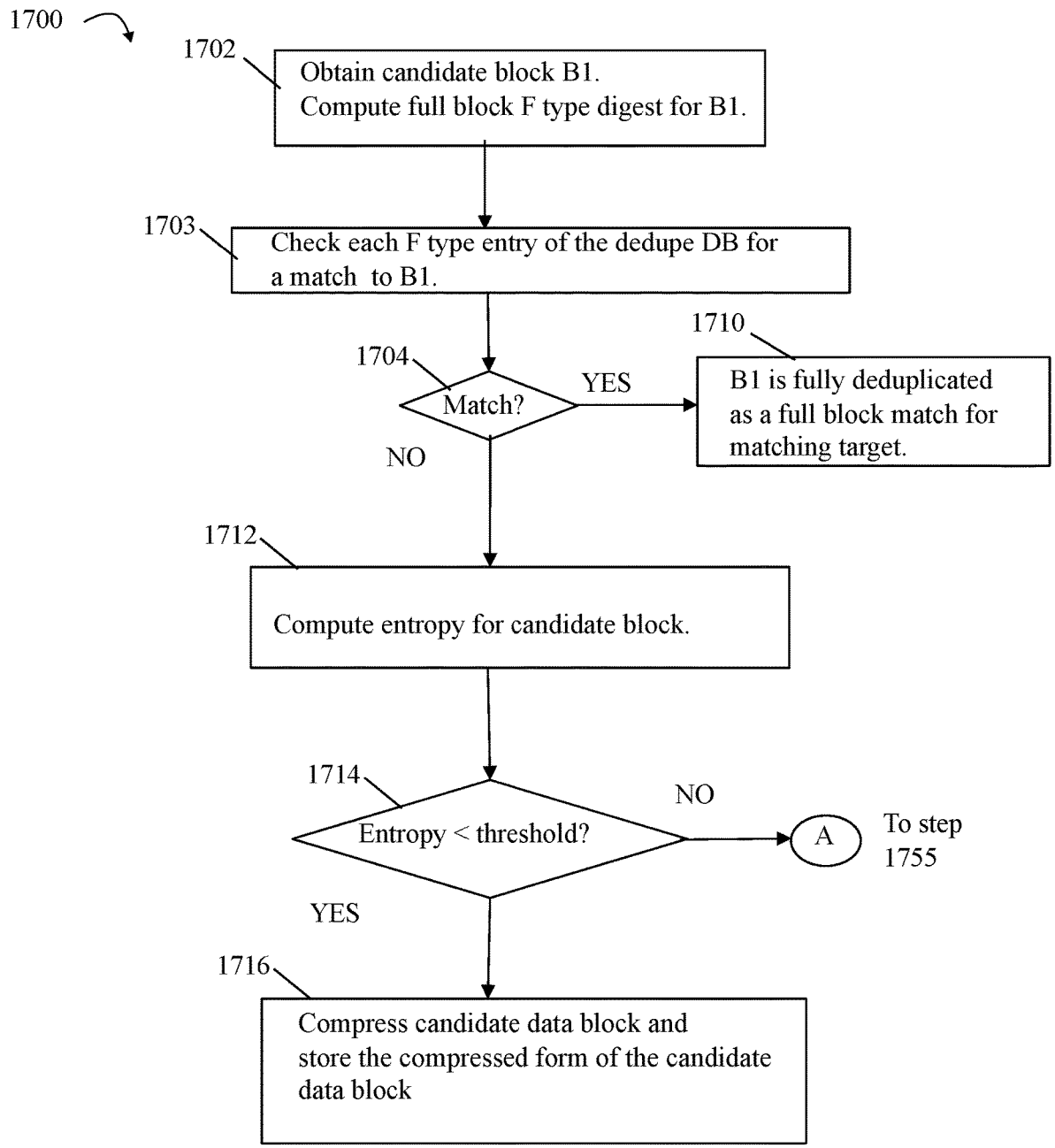
Figure 16B:
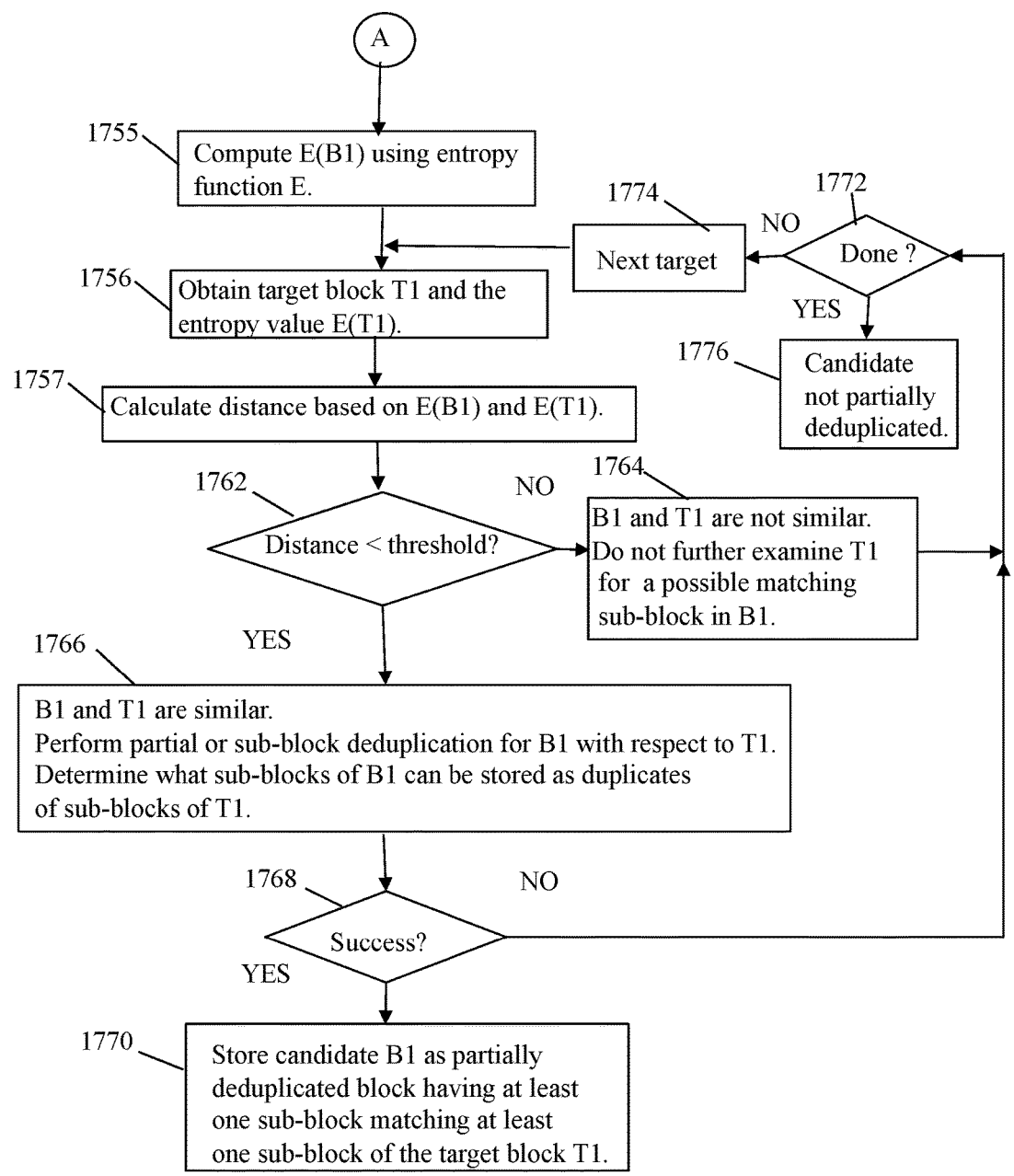

Referring to FIGS. 16A and 16B, shown are flowcharts of processing steps that may be performed in an embodiment in accordance with the techniques herein. The flowcharts 1700 and 1750 provide additional detail regarding another embodiment in which the distance function is computed, such as in EQUATION 1, based on the entropy values for the data blocks B1 and T1. Additionally, the flowcharts 1700 and 1750 also utilize entropy in determining whether to compress a candidate block or otherwise perform partial deduplication processing for the candidate block. The flowcharts 1700 and 1750 indicate processing steps that may be performed for a single candidate block whereby the steps of the flowcharts 1700 and 1750 may be repeated for subsequent candidate blocks.

At the step 1702, the candidate block B1 is obtained. The step 1702 includes computing an F type digest for the candidate block B1. As described herein the F type digest for B1 may be computed using a hash function and the full block content of B1. From the step 1702, control proceeds to the step 1703 where processing is performed to check each F type entry of the dedupe DB 150 for a match to B1. The step 1703 may include determining if there is an existing F type entry in the dedupe DB having a digest that matches the computed full block F type digest for B1 (as computed in the step 1702), and if so, comparing the actual content of the target data block having the matching entry to the content of B1. From the step 1703, control proceeds to the step 1704. At the step 1704, a determination is made as to whether a matching target block in the dedupe DB was found for the candidate block B1. If the step 1704 evaluates to yes, control proceeds to the step 1710. At the step 1710, B1 is processed as a full deduplicated block of the matching target block. The step 1710 is similar to the step 1408 of the FIG. 14. If the step 1704 evaluates to no, control proceeds to the step 1712.

At the step 1712, the entropy for the candidate block is computed, for example, such as based on EQUATION 3. From the step 1712, control proceeds to the step 1714. At the step 1714, a determination is made as to whether the entropy for the candidate block is less than the entropy threshold. If the step 1714 evaluates to yes, control proceeds to the step 1716. At the step 1716, processing is performed to compress the candidate data block and store the compressed form of the candidate data block. If the step 1714 evaluates to no, control proceeds to the step 1755.

At the step 1755, processing is performed to compute E(B1) using the entropy function E. From the step 1755, control proceeds to the step 1756. At the step 1756, a target block T1 and the entropy value E(T1) for the target block are obtained. From the step 1756, control proceeds to the step 1757. At the step 1757, processing is performed to calculate the distance between E(B1) and E(T1), such as using EQUATION 1. From the step 1757, control proceeds to the step 1762 where a determination is made as to whether the distance is less than a specified threshold. Consistent with discussion herein, the distance denotes a measurement of similarity between the candidate data block B1 and the target data block T1.

If the step 1762 evaluates to no, control proceeds to the step 1764 where it is determined that B1 and T1 are not similar. In connection with the step 1764, processing does not further examine T1 for a possible matching sub-block in B1. From the step 1764, control proceeds to the step 1772 where a determination is made as to whether processing of all existing targets has completed. If step 1772 evaluates to yes, control proceeds to the step 1776 where the candidate is not partially deduplicated and where the candidate block is stored as a new target block as denoted in the step 1416 of the FIG. 14. If the step 1772 evaluates to no, control proceeds to the step 1774 to obtain the next target block. From the step 1774, control proceeds to the step 1756 to continue partial or sub-block deduplication processing using the next target block as the current target block T1.

If the step 1762 evaluates to yes, control proceeds to the step 1766 where it is determined that B1 and T1 are similar. The step 1766 may include performing partial or sub-block deduplication for B1 with respect to T1. The step 1766 may include determining what sub-blocks of B1 can be stored as duplicates of the existing target block T1. From the step 1766, control proceeds to the step 1768 where a determination is made as to whether partial deduplication of B1 with respect to T1 was successful. Put another way, at the step 1768, a determination is made as to whether at least one sub-block of B1 can be deduplicated whereby the at least one sub-block of B1 can be stored as a matching sub-block of T1. If the step 1768 evaluates to yes, control proceeds to the step 1770. At the step 1770, processing is performed to store the candidate block B1 as a partially deduplicated block having at least one sub-block matching at least one sub-block of the target block T1. The step 1770 is similar to the step 1414 of FIG. 14. If the step 1768 evaluates to no, control proceeds to the step 1772.

The techniques herein may be performed by any suitable hardware and/or software. For example, the techniques herein may be performed by executing code which is stored on any one or more different forms of computer-readable media, where the code may be executed by one or more processors, for example, such as processors of a computer or other system, an ASIC (application specific integrated circuit), and the like. Computer-readable media may include different forms of volatile (e.g., RAM) and non-volatile (e.g., ROM, flash memory, magnetic or optical disks, or tape) storage which may be removable or non-removable.

While the invention has been disclosed in connection with embodiments shown and described in detail, their modifications and improvements thereon will become readily apparent to those skilled in the art. Accordingly, the spirit and scope of the present invention should be limited only by the following claims.

What is claimed is:

1. A method of processing data comprising:
 receiving a candidate data block;
 determining that the candidate block does not have a full block match to an existing target block in a deduplication database; and
 responsive to determining that the candidate block does not have a full block match to an existing target block in the deduplication database, performing processing including:
  determining whether a first entropy value for the candidate data block is less than an entropy threshold;
  responsive to determining that the first entropy value is less than the entropy threshold, storing the candidate data block in a compressed form; and
  responsive to determining that the first entropy value is not less than the entropy threshold, performing partial deduplication processing for the candidate block, wherein the partial deduplication processing includes:
   computing a distance using a distance function, wherein the distance is an entropy-based distance and denotes a measurement of similarity between the candidate data block and a target data block, wherein the distance function computes the distance using the first entropy value for the candidate data block and a second entropy value for the target data block, wherein an entropy function computes the first entropy value denoting a randomness measurement of a distribution of bits within the candidate data block, and wherein the entropy function computes the second entropy value denoting a randomness measurement of a distribution of bits within the target data block; and
   determining, using the distance, whether to perform data deduplication of the candidate data block with respect to the target data block to identify at least one sub-block of the candidate data block that is a duplicate of at least one sub-block of the target data block.

2. The method of claim 1, wherein the distance function computes the distance as an absolute value of a difference between the first entropy value for the candidate data block and the second entropy value for the target data block.

3. The method of claim 2, wherein the distance function computes a normalized distance value as the distance.

4. The method of claim 2, wherein the partial deduplication processing further comprises:
 determining whether the distance is less than a threshold distance.

5. The method of claim 4, wherein the partial deduplication processing further comprises:
 responsive to determining the distance is less than a threshold distance, determining the candidate data block is similar to the target data block and performing first processing.

6. The method of claim 5, wherein the first processing includes:
 determining whether at least one sub-block of the candidate data block matches at least one sub-block of the target data block; and
 responsive to determining at least one sub-block of the candidate data block matches at least one sub-block of the target data block, performing second processing that stores the candidate data block as a partially deduplicated data block with at least one sub-block that is a duplicate of another sub-block of the target data block.

7. The method of claim 1, further comprising:
determining whether a first digest matches a second digest, wherein the first digest is computed for the candidate data block using a hash function and wherein the second digest is computed for the target data block using the hash function;
responsive to determining the first digest matches the second digest, comparing content of the candidate data block to content of the target data block;
determining, in accordance with said comparing, whether the candidate data block matches the target data block; and
responsive to determining the candidate data block matches the target data block, storing the candidate data block as a fully deduplicated data block.

8. The method of claim 7, wherein the hash function is a cryptographic hash function.

9. The method of claim 1, wherein the method is performed as part of inline processing of the candidate data block in connection with an I/O path or data path when servicing an I/O accessing the candidate data block.

10. The method of claim 1, wherein the method is performed offline and not as part of inline processing of the candidate data block in connection with an I/O path or data path when servicing an I/O accessing the candidate data block.

11. A method of processing data comprising:
receiving a candidate data block;
computing a distance using a distance function, wherein the distance is an entropy-based distance and denotes a measurement of similarity between the candidate data block and a target data block;
determining, using the distance, whether to perform data deduplication of the candidate data block with respect to the target data block to identify at least one sub-block of the candidate data block that is a duplicate of at least one sub-block of the target data block;
receiving a first entropy value for the candidate data block;
determining whether the first entropy value is less than an entropy threshold;
responsive to determining the first entropy value is less than the entropy threshold, performing processing to store the candidate data block in a compressed form; and
responsive to determining the first entropy value is not less than the entropy threshold, performing partial deduplication processing for the candidate data block, wherein said partial deduplication processing for the candidate block includes performing said computing a distance and said determining, using the distance, whether to perform data deduplication of the candidate data block with respect to the target data block to identify at least one sub-block of the candidate data block that is a duplicate of at least one sub-block of the target data block.

12. The method of claim 11, wherein the target data block is one of a plurality of target data blocks and each of the plurality of target data blocks is associated with one of a plurality of entropy values denoting the computed entropy value for said each target data block, and wherein the target data block has an associated one of the plurality of entropy values that is closest to the first entropy value with respect to all others of the plurality of entropy values.

13. A system comprising:
a processor; and
a memory comprising code stored thereon that, when executed, performs a method of processing data comprising:
receiving a candidate data block;
determining that the candidate block does not have a full block match to an existing target block in a deduplication database; and
responsive to determining that the candidate block does not have a full block match to an existing target block in the deduplication database, performing processing including:
determining whether a first entropy value for the candidate data block is less than an entropy threshold;
responsive to determining that the first entropy value is less than the entropy threshold, storing the candidate data block in a compressed form; and
responsive to determining that the first entropy value is not less than the entropy threshold, performing partial deduplication processing for the candidate block, wherein the partial deduplication processing includes:
computing a distance using a distance function, wherein the distance is an entropy-based distance and denotes a measurement of similarity between the candidate data block and a target data block, wherein the distance function computes the distance using the first entropy value for the candidate data block and a second entropy value for the target data block, wherein an entropy function computes the first entropy value denoting a randomness measurement of a distribution of bits within the candidate data block, and wherein the entropy function computes the second entropy value denoting a randomness measurement of a distribution of bits within the target data block; and
determining, using the distance, whether to perform data deduplication of the candidate data block with respect to the target data block to identify at least one sub-block of the candidate data block that is a duplicate of at least one sub-block of the target data block.

14. A non-transitory computer readable medium comprising code stored thereon that, when executed, performs a method of processing data comprising:
receiving a candidate data block;
determining that the candidate block does not have a full block match to an existing target block in a deduplication database; and
responsive to determining that the candidate block does not have a full block match to an existing target block in the deduplication database, performing processing including:
determining whether a first entropy value for the candidate data block is less than an entropy threshold;
responsive to determining that the first entropy value is less than the entropy threshold, storing the candidate data block in a compressed form; and
responsive to determining that the first entropy value is not less than the entropy threshold, performing partial deduplication processing for the candidate block, wherein the partial deduplication processing includes:
  computing a distance using a distance function, wherein the distance is an entropy-based distance and denotes a measurement of similarity between the candidate data block and a target data block, wherein the distance function computes the distance using the first entropy value for the candidate data block and a second entropy value for the target data block, wherein an entropy function computes the first entropy value denoting a randomness measurement of a distribution of bits within the candidate data block, and wherein the entropy function computes the second entropy value denoting a randomness measurement of a distribution of bits within the target data block; and
  determining, using the distance, whether to perform data deduplication of the candidate data block with respect to the target data block to identify at least one sub-block of the candidate data block that is a duplicate of at least one sub-block of the target data block.

15. The non-transitory computer readable medium of claim 14, wherein the distance function computes the distance as an absolute value of a difference between the first entropy value for the candidate data block and the second entropy value for the target data block.

16. The non-transitory computer readable medium of claim 15, wherein the distance function computes a normalized distance value as the distance.

17. The non-transitory computer readable medium of claim 15, wherein the partial deduplication processing further comprises:
  determining whether the distance is less than a threshold distance.

18. The non-transitory computer readable medium of claim 17, wherein the partial deduplication processing further comprises:
  responsive to determining the distance is less than a threshold distance, determining the candidate data block is similar to the target data block and performing first processing.

19. The non-transitory computer readable medium of claim 18, wherein the first processing includes:
  determining whether at least one sub-block of the candidate data block matches at least one sub-block of the target data block; and
  responsive to determining at least one sub-block of the candidate data block matches at least one sub-block of the target data block, performing second processing that stores the candidate data block as a partially deduplicated data block with at least one sub-block that is a duplicate of another sub-block of the target data block.

20. A system comprising:
a processor; and
a memory comprising code stored thereon that, when executed, performs a method of processing data comprising:
  receiving a candidate data block;
  computing a distance using a distance function, wherein the distance is an entropy-based distance and denotes a measurement of similarity between the candidate data block and a target data block;
  determining, using the distance, whether to perform data deduplication of the candidate data block with respect to the target data block to identify at least one sub-block of the candidate data block that is a duplicate of at least one sub-block of the target data block;
  receiving a first entropy value for the candidate data block;
  determining whether the first entropy value is less than an entropy threshold;
  responsive to determining the first entropy value is less than the entropy threshold, performing processing to store the candidate data block in a compressed form; and
  responsive to determining the first entropy value is not less than the entropy threshold, performing partial deduplication processing for the candidate data block, wherein said partial deduplication processing for the candidate block includes performing said computing a distance and said determining, using the distance, whether to perform data deduplication of the candidate data block with respect to the target data block to identify at least one sub-block of the candidate data block that is a duplicate of at least one sub-block of the target data block.

21. A non-transitory computer readable memory comprising code stored thereon that, when executed, performs a method of processing data comprising:
  receiving a candidate data block;
  computing a distance using a distance function, wherein the distance is an entropy-based distance and denotes a measurement of similarity between the candidate data block and a target data block;
  determining, using the distance, whether to perform data deduplication of the candidate data block with respect to the target data block to identify at least one sub-block of the candidate data block that is a duplicate of at least one sub-block of the target data block;
  receiving a first entropy value for the candidate data block;
  determining whether the first entropy value is less than an entropy threshold;
  responsive to determining the first entropy value is less than the entropy threshold, performing processing to store the candidate data block in a compressed form; and
  responsive to determining the first entropy value is not less than the entropy threshold, performing partial deduplication processing for the candidate data block, wherein said partial deduplication processing for the candidate block includes performing said computing a distance and said determining, using the distance, whether to perform data deduplication of the candidate data block with respect to the target data block to identify at least one sub-block of the candidate data block that is a duplicate of at least one sub-block of the target data block.

* * * * *